(12) United States Patent
Mori et al.

(10) Patent No.: US 7,081,785 B2
(45) Date of Patent: Jul. 25, 2006

(54) COMPARING CIRCUIT AND OFFSET COMPENSATING APPARATUS

(75) Inventors: Hirokazu Mori, Kawasaki (JP); Yusaku Tada, Sagamihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/830,139

(22) Filed: Apr. 23, 2004

(65) Prior Publication Data
US 2004/0263230 A1    Dec. 30, 2004

(30) Foreign Application Priority Data
Apr. 24, 2003 (JP) ............... 2003-119925

(51) Int. Cl.
*H03L 5/00* (2006.01)
(52) U.S. Cl. .................. 327/307; 330/9; 330/53
(58) Field of Classification Search ................. 327/307; 330/9, 53, 149; 375/296, 297; 455/63
See application file for complete search history.

(56) References Cited

U.S. PATENT DOCUMENTS

| | | | | |
|---|---|---|---|---|
| 3,988,689 A | | 10/1976 | Ochi et al. .................. | 330/9 |
| 4,229,703 A | * | 10/1980 | Bustin .................... | 327/307 |
| 4,356,450 A | | 10/1982 | Masuda .................... | 330/9 |
| 5,793,230 A | * | 8/1998 | Chu et al. .................. | 327/77 |
| 6,426,663 B1 | * | 7/2002 | Manlove et al. ............ | 327/307 |
| 6,894,568 B1 | * | 5/2005 | Seetharaman et al. ...... | 330/308 |
| 2001/0048344 A1 | * | 12/2001 | Isken et al. ............... | 330/9 |
| 2002/0130696 A1 | * | 9/2002 | Yoshizawa .................. | 327/307 |
| 2003/0006920 A1 | | 1/2003 | Mori ......................... | 341/118 |

FOREIGN PATENT DOCUMENTS

| | | |
|---|---|---|
| JP | 7-202693 | 8/1995 |
| JP | 10-145194 | 5/1998 |
| JP | 11-68476 | 3/1999 |
| JP | 2002-237742 | 8/2002 |

* cited by examiner

*Primary Examiner*—Tuan T. Lam
(74) *Attorney, Agent, or Firm*—McDermott Will & Emery LLP

(57) ABSTRACT

While a switch SW4 is connected to "a"-terminal side, offset of a differential output voltage "A−" of a D/A converter 500a (500b) is held in a comparator 400, and is reflected to a reference voltage. Thereafter, the switch SW4 is switched to a "b"-terminal side, and offset of a differential output voltage "A+" of the D/A converter 500a (500b) is measured by the comparator 400. An error signal is outputted to a counter 412 so as to count up the counter 412. Such an operation is repeatedly carried out in which the count value is added to 1.7 V and then the added count value is inputted into the D/A converter 500a (500b), and such a count value latched in a latch at timing when the error signal is inverted is defined as an offset correction value.

4 Claims, 24 Drawing Sheets

COMPARING CIRCUIT AND OFFSET COMPENSATING APPARATUS

BACKGROUND OF THE INVENTION

The present invention is related to an offset compensating apparatus for compensating a DC offset voltage of a D/A converter which is employed in, for example, a digital wireless telephone, and also related to a comparing circuit for measuring offset of a D/C converter, which is employed in this offset compensating apparatus.

In a digital wireless telephone, a signal to be transmitted is modulated in a digital circuit portion of a modulator. Thereafter, a modulated digital signal is converted into an analog signal by a D/A converter. The converted analog signal is coupled to a wireless frequency unit of the digital wireless telephone so as to be transmitted as a wireless signal. This D/A converter owns the following problems.

That is, there are some cases that DC offset having a low level, which is slowly changed, is produced in an analog output of the D/A converter. Normally, the occurrence of this DC offset is caused by such a reason that characteristics of circuit components could not be achieved as ideal characteristics, but has no relationship with respect to a digital signal which should be converted. However, when this DC offset is produced, an undesirable result may occur in the D/A converter, and thus, may interfere with a transmission of a wireless signal. As this undesirable result, a carrier wave is leaked in a transmission signal of a mobile telephone. As a consequence, it is desirable to compensate for the DC offset of the D/A converter.

To cancel the DC offset of the D/A converter, an amount of the DC offset must be measured as an initial condition. To perform this measurement, a comparator (voltage comparing circuit) is employed. Such a DC offset canceling arrangement is known in the technical field (see patent publication: Japanese Laid-open Patent Application NO. HEI-7-202693). In this known DC offset canceling arrangement, a control signal used to compensate offset is obtained based upon a comparison result made by this comparator in order to cancel the DC offset of the D/A converter.

As previously explained, in order that the DC offset of the D/A converter may be canceled, the offset amount must be measured by employing the comaprator. To measure the offset amount in a correct manner, as apparent from the technical principle, the offset of this comparator itself must be defined within a predetermined range. While a comparator (voltage comparing circuit) is mainly constituted by a differential amplifier, this differential amplifier (differential circuit) is designed in a manner that a right-sided current capability may be balanced with respect to a left-sided current capability. However, offset may be usually produced due to such a reason caused by fluctuations in actual sizes of transistors which constitute the differential amplifying circuit. It should be understood that this offset implies fluctuations contained in characteristics of the respective transistors which constitute the differential pair of this differential amplifying circuit.

The above-described offset amount of the comparator is considerably fluctuated, while this offset amount is produced due to the characteristic fluctuations as to the respective transistors which constitute the differential pair. There are some cases that this fluctuated offset amount is occasionally and largely deviated from the allowable range. In the case that the DC offset of the D/C converter is adjusted by employing the comparator having such an offset amount which exceeds the allowable range, namely in such a case that the offset adjustment of the D/C converter is carried out by the negative feedback control with employment of the comparator having the low comparison precision, the offset would be originally converged within several mV (millivolts). However, the following fact could be confirmed. That is, the offset higher than, or equal to 20 mV is still left in the D/A converter.

To solve the above-described problem, the offset (namely, offset of right/left current capabilities) as to the comparator must be necessarily canceled, while this comparator is used so as to cancel the DC offset of the D/A converter. However, it is practically difficult to provide such an exclusively-designed circuit capable of adjusting the offset of the comparator in view of the following points. That is, an increase of an occupied area of a semiconductor device (IC) must be prevented, or lower power consumption is required. The above-explained DC offset compensating method requires a separate means, since the precision of the comparator used to measure the offset amount of the D/A converter may constitute the very important factor.

SUMMARY OF THE INVENTION

The present invention has been made to solve the above-described problem, and therefore, has an object to provide both a comparing circuit capable of improving precision of an offset amount to be measured in low cost, and also, to provide an offset compensating apparatus capable of canceling DC offset of a D/A converter in high precision and in low cost with employment of the above-described comparing circuit.

According to first aspect of the invention, provided is a comparing circuit in which two signals are compared with each other, which are entered into a differential pair formed by a first transistor and a second transistor, by a differential circuit having the differential pair and a load circuit of the differential pair, comprising: phase adjusting means for operating the differential circuit as an operational amplifying circuit; phase inverting means for inverting a phase of an output signal from the differential circuit; feedback means for feeding back an output signal of the phase inverting means as a substrate biasing voltage of the first transistor in the case that the differential circuit is operated as the operational amplifying circuit by the phase adjusting means, and either same voltages or different voltages are applied to the first transistor and the second transistor of the differential pair respectively; and holding means for holding the substrate biasing voltage of the first transistor in a predetermined time duration, which is fed back by the feedback means.

In accordance with the above-described circuit arrangement of the comparing circuit, after the phase adjusting operation is carried out so as to operate the differential circuit as the operational amplifying circuit, in the case that either the same voltages or the different voltages are applied to the first transistor and the second transistor employed in the differential pair circuit, the phase of the output voltage derived via the load circuit is inverted and this phase-inverted output voltage is applied to the substrate of the first transistor. As a result, the potential at the substrate of the first transistor may become equal to the potential at the substrate of the second transistor. Since the characteristics of both the first and second transistors are made identical to each other and this condition is maintained for the predetermined time period, such a circuit capable of reducing the offset amount of the comparing circuit so as to improve the comparison precision can be constructed with employment of the simple structure.

According to second aspect of the invention, provided is an offset compensating apparatus for compensating offset of an inverted signal and a non-inverted signal, which are outputted from paired output ports owned by an electronic apparatus, comprising: input means for inputting a predetermined signal into the electronic apparatus; adjusting means operated in such a manner that a calculation is made of a difference between an inverted signal which is outputted from the electronic apparatus in correspondence with the predetermined input signal and a reference signal having no relationship with respect to the inverted signal, and the calculated difference value is held and also reflected onto the reference signal; comparing means for conducting an error signal indicative of a difference between an non-inverted signal which is outputted from the electronic apparatus in correspondence with the predetermined signal and a signal produced by reflecting the held difference value onto the reference signal; calculating means operated in such a manner that a value corresponding to the error signal is added to the predetermined signal, and the added signal is entered to the electronic apparatus by the input means; storage means for storing there into a converged value of the error signal; and compensating means for defining the converged value stored in the storage means as an offset compensating value of the electronic apparatus.

In accordance with the above-described arrangement of the offset compensating apparatus, the difference between the reference signal and the inverted signal outputted when a predetermined signal is inputted to the electronic apparatus is calculated and this calculated difference value is maintained. Also, this difference value is reflected onto the reference signal. Next, such an error signal indicative of the difference between the non-inverted signal which is outputted from the electronic apparatus in correspondence with the predetermined signal and the signal produced by reflecting the held difference value onto the reference signal is conducted. Then, such an operation is repeatedly carried out in such a manner that the value corresponding to the error signal is added to the predetermined signal, and the added signal is entered to the electronic apparatus by the input means. As a result, such a value obtained when the error signal is converged is defined as the compensation value for compensating the offset of the electronic apparatus. In this case, if such a comparing circuit having higher comparing precision is employed as the above-described comparing means for conducting the error signal indicative of the difference between the non-inverted signal and the signal to which the reference signal has been reflected, then the precision as to the offset compensating value of the electronic apparatus can be improved, so that the offset of the electronic apparatus can be canceled in high precision.

According to third aspect of the invention, in the offset compensating apparatus, the calculating means is a counter.

In accordance with the above-described arrangement, if the counter is operated when the error signal is outputted from the comparing means whereas the counting operation of the counter is reset when no error signal is outputted from the comparing means, then a counter value obtained just before the resetting operation may become the converged value of the error signals.

According to fourth aspect of the invention, in the offset compensating apparatus, the calculating means is an adding-and-subtracting circuit.

In accordance with the above-described arrangement, if the adding-and-subtracting circuit (up/down counter) is operated when the error signal is outputted from the comparing means whereas the operation of the adding-and-subtracting circuit is reset when no error signal is outputted from the comparing means, then such an adding-and-subtracting value obtained just before the resetting operation may constitute the converged value of the error signals. In this case, since the adding-and-subtracting circuit may perform either the adding operation or the subtracting operation in response to a polarity of an error signal outputted from the comparing means, the converged value of the error signals can be obtained irrespective of the polarity of the error signal.

According to fifth aspect of the invention, in the offset compensating apparatus, the storage means stores thereinto a half value of the converged value of the error signal.

In accordance with the above-described arrangement, if the half value of the converged value of the error signal is stored in the storage means and this half value is employed as the offset compensating value, only a half portion of the inverted signal is merely corrected. However, since the non-inverted signal is also inverse-corrected, the offset of the electronic apparatus can be canceled, and further, the offset of the current adding type D/A converter may be canceled.

According to sixth aspect of the invention, in the offset compensating apparatus, both the holding means and the comparing means correspond to the comparing circuit of the first aspect of the invention.

In accordance with the above-described arrangement, in such a case that a difference is given to two input signals of the differential circuit in the comparing circuit recited in the first aspect of the invention with reference to the reference signal, the phase of this output voltage is inverted so as to apply this phase-inverted voltage to the substrate of the first transistor, so that the difference is added to the reference signal and therefore this difference can be reflected onto the reference signal. As a consequence, when the adjusting means and the comparing means function as the comparing circuit, since the reference signal to which the difference has been reflected is compared with the non-inverted signal to be compared, the adverse influence caused by the offset of the comparing circuit can be eliminated, and the comparing operation can be carried out in high precision.

According to seventh aspect of the invention, provided is an offset compensating apparatus for compensating offset of an inverted signal and a non-inverted signal, which are outputted from paired output ports owned by an electronic apparatus, comprising: input means for inputting a predetermined signal into the electronic apparatus; first comparing means for conducting a first error signal indicative of a difference between an inverted signal which is outputted from the electronic apparatus in correspondence with the predetermined signal and a reference signal having no relationship with respect to the inverted signal; first calculating means operated in such a manner that a value corresponding to the first error signal is added to the predetermined signal, and the added signal is entered to the electronic apparatus by the input means; first storage means for storing there into a converged value of the first error signal; second comparing means for conducting a second error signal indicative of a difference between a non-inverted signal which is outputted from the electronic apparatus in correspondence with the predetermined signal and a reference signal having no relationship with respect to the non-inverted signal; second calculating means operated in such a manner that a value corresponding to the second error signal is added to the predetermined signal, and the added signal is entered to the electronic apparatus by the input means; second storage means for storing there into a converged value of the second error signal; and offset compensating means for calculating an offset compensating value of the electronic apparatus by employing the respective converged values stored in the first storage means and the second storage means.

In accordance with the above-explained arrangement of the offset compensating apparatus, such an operation is repeatedly carried out so as to acquire the converged value of the first error signal, and then this converged value is stored. In this operation, the predetermined signal is inputted to the electronic apparatus, the first error signal indicative of the difference between the inverted signal which is outputted from the electronic apparatus in correspondence with the predetermined signal and the reference signal having no relationship with respect to the inverted signal is conducted, and the value corresponding to the first error signal is added to the predetermined signal, and then the added signal is entered to the electronic apparatus. Thereafter, the second error signal indicative of the difference between the non-inverted signal which is outputted from the electronic apparatus in correspondence with the predetermined signal and the reference signal having no relationship with respect to the non-inverted signal is conducted. Such an operation is carried out so as to acquire the converged value of the second error signal, and then this converged value is stored. In this operation, the second error signal indicative of the difference between the non-inverted signal which is outputted from the electronic apparatus in correspondence with the predetermined signal and the reference signal having no relationship with respect to the non-inverted signal is conducted, and, a value corresponding to the second error signal is added to the predetermined signal, and thereafter the added signal is entered to the electronic apparatus. Next, a calculation is made of both the converged value of the first error signal and the converged value of the second error signal in order that both the offset of the first comparing means and the offset of the second comparing means are canceled which have be entered when the first error signal and the second error signal are conducted. As a result, the offset compensating value for the electronic apparatus can be obtained in high precision, which is not aversely influenced by the offset owned by both the first and second comparing means during comparing operations. Also, the normal comparing circuits can be employed as the first and second comparing means.

According to eighth aspect of the invention, in the offset compensating apparatus, the offset compensating value is calculated by adding the converged value stored in the first storage means to the converged value stored in the second storage means.

In accordance with the above-described arrangement, if the converged value of the first error signal stored in the first storage means is added to the converged value of the second error signal stored in the second storage means, since the offset of the first comparing means and the offset of the second compensating means own the opposite phases to each other, then both of these offset amounts can be canceled. When the added value is reduced by ½, the offset compensating value of the electronic apparatus can be obtained in high precision without any adverse influence caused by the offset amounts of the first and second comparing means.

According to ninth aspect of the invention, in the offset compensating apparatus, the converged value of the first error signal and the converged value of the second error signal are reduced by ½ respectively, and then, the ½-reduced converged values are stored into the first storage means and the second storage means, respectively.

In accordance with the above-explained arrangement, since the converged values of both the first and second error signals stored in the first and second storage means have already been reduced by ½, if these converged values are added to each other so as to cancel the offset of the first and second comparing means, then the offset compensating value of the electronic apparatus can be immediately obtained in high precision.

According to tenth aspect of the invention, in the offset compensating apparatus, the first and second calculating means are counters.

In accordance with the above-described arrangement, if the counter is operated when the first and second error signals are outputted from the first and second comparing means whereas the counting operation of the counter is reset when the first and second error signals are not outputted from the first and second comparing means, then a counter value obtained just before the resetting operation may become the converged value of the first and second error signals.

According to eleventh aspect of the invention, in the offset compensating apparatus, the first and second calculating means are adding-and-subtracting circuits.

In accordance with the above-described arrangement, if the adding-and-subtracting circuit (up/down counter) is operated when the first and second error signals are outputted from the first and second comparing means whereas the operation of the adding-and-subtracting circuit is reset when both the first and second error signals are not outputted from the first and second comparing means, then such an adding-and-subtracting value obtained just before the resetting operation may constitute the converged value of the first and second error signals. In this case, since the adding-and-subtracting circuit may perform either the adding operation or the subtracting operation in response to polarities of first and second error signals outputted from the first and second comparing means, the converged value of the first and second error signals can be obtained irrespective of the polarities of the first and second error signals.

According to the twelfth aspect of the invention, in the offset compensating apparatus, the electronic apparatus corresponds to a D/A (digital-to-analog) converting circuit.

In accordance with the above-explained arrangement, the offset of the D/A converting circuit can be canceled in higher precision, so that the converting precision can be improved.

DETAILED DESCRIPTION OF THE PREFERRED EMBODIMENTS

Referring now to drawings, various embodiments of the present invention will be described.

First Embodiment

Figure 1:
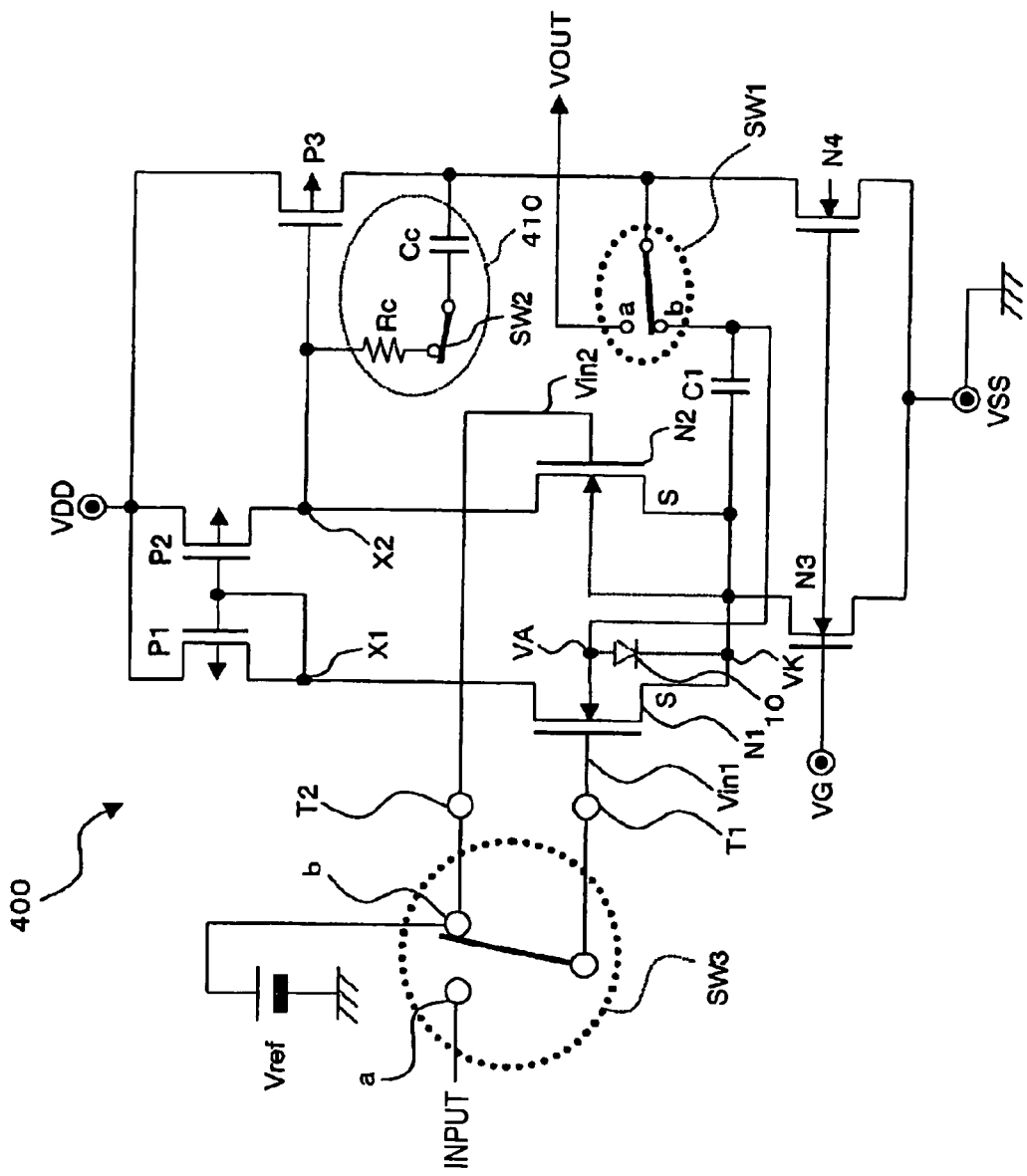
FIG. 1 is a circuit diagram for indicating an arrangement of a comparing circuit according to a first embodiment of the present invention.

FIG. 1 is a circuit diagram for indicating an arrangement of a comparing circuit according to a first embodiment of the present invention. As shown in the drawing, the comparing circuit (will also be referred to as a "comparator" hereinafter) is equipped with NMOS transistors M1 and N2, which constitute a differential pair; a constant current source transistor N3; load transistors (PMOS transistors) P1 and P2, which constitute a current mirror; and output-stage transistors (constructed of PMOS transistor P3 and constant current source transistor N4) which constitute a push-pull type output-stage circuit. The comparing circuit is also equipped with a phase adjusting resistor Rc; a phase adjusting capacitor Cc; a phase adjusting circuit 410 constructed of a switch SW2 which is brought into an ON state while offset is adjusted; a DC cutoff capacitor C1; a switch SW1; another switch Sw2; another switch SW3; an input terminal T1; and another input terminal T2.

In this case, either an input voltage (INPUT) or a reference voltage (will also be referred to as bias voltage "Vref") is applied via an input terminal "T1" to a differential pair transistor N1. Also, the reference voltage (Vref) is continuously applied via another input terminal "T2" to the differential pair transistor (N2).

Symbol "N" which is applied to each of these transistors described in FIG. 1 implies an N type MOS transistor, and symbol "P" which is applied to each of these transistors described in FIG. 1 implies a P type MOS transistor. It should be noted that symbol "VDD" represents a power supply voltage (for example, 3V), and symbol "VSS" indicates a minimum voltage (GND) of the comparing circuit. The switches SW1 to SW3 are provided in order to selectively switch a normal operating mode and an offset adjusting mode.

The switch SW3 which receives the input signal (INPUT) is switched to an "a"-terminal side during the normal operation, and is switched to a "b"-terminal side when the offset adjusting mode is set. Similarly, the switch SW1 is switched to an "a"-terminal side during the normal operation, and is switched to a "b"-terminal side when the offset adjusting mode is set.

Furthermore, the switch SW2 is turned ON in the offset adjusting mode, and is turned OFF during the normal operation while the comparator is operated. This is because of the below-mentioned reason. That is, in the case that a negative feedback control operation is carried out so as to perform an offset adjustment, a control signal for controlling a substrate bias must be changed in a linear manner. To this end, an operation of a linear region of an analog circuit is required.

As a consequence, the switch SW2 is turned ON in the offset adjusting mode so as to bring a phase adjusting circuit 410 into an active state. As a result, the comparator can be operated as an operational amplifier (op-amp).

It should be understood that in FIG. 1, the capacitor C1 may function as a DC cutoff capacitor capable of avoiding that a substrate bias of the NMOS transistor N1 gives an adverse influence to either a source potential or a substrate potential of the NMOS transistor N2. Furthermore, this capacitor C1 functions as a holding capacitor. That is, even after an offset adjustment was accomplished and then both the switches SW1 and SW3 have been switched to the a-terminal side, this holding capacitor continuously applies an adjusted voltage to the substrate of the NMOS transistor N1 for at least a predetermined time period.

Figure 2:
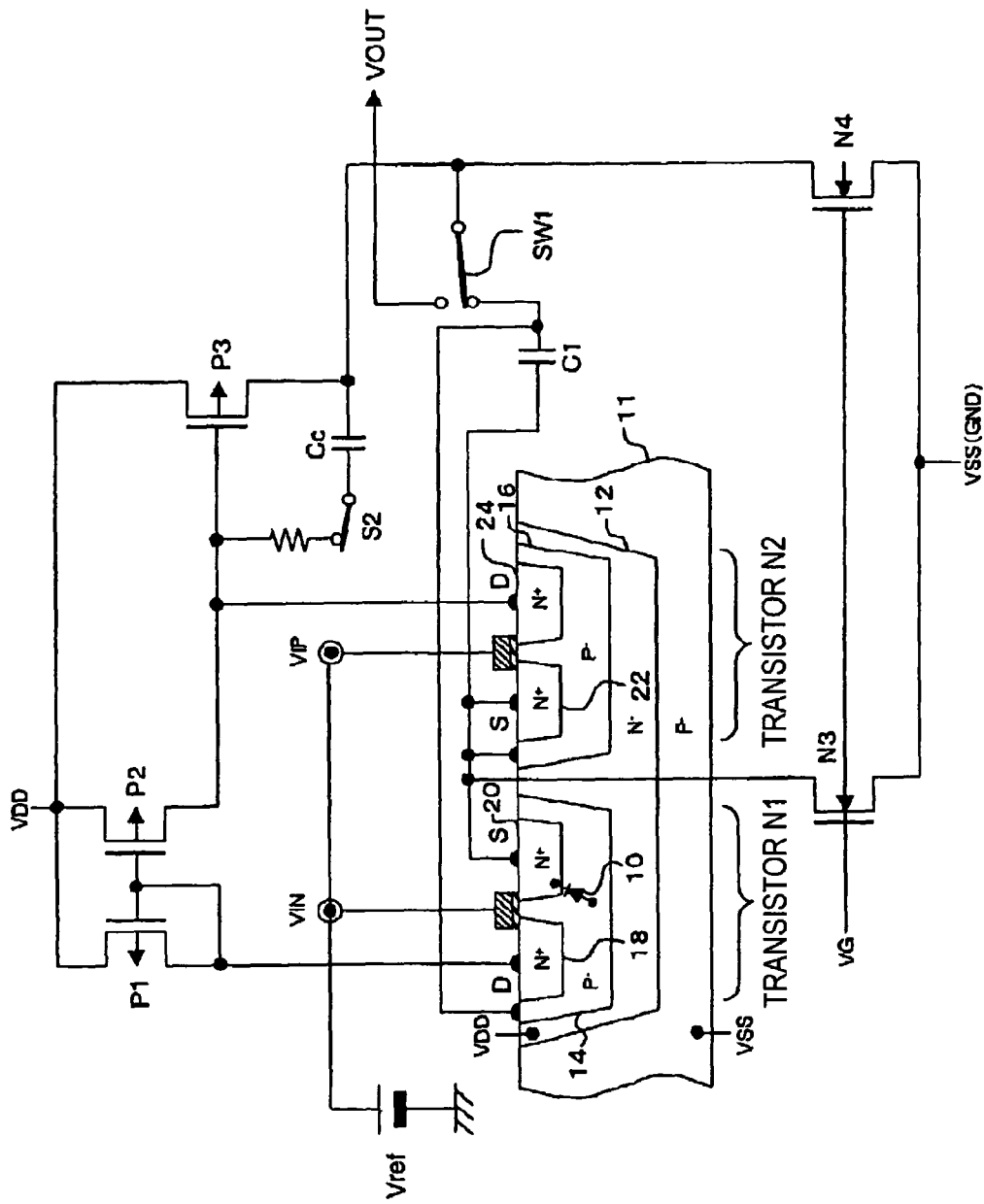
FIG. 2 is a circuit diagram for showing a structural example of transistors indicated in FIG. 1.

FIG. 2 is a diagram for indicating a sectional structure of a semiconductor device as to the NMOS transistors (N1 and N2) which constitute the differential pair in the comparing circuit of FIG. 1. As indicated in this drawing, the NMOS transistors N1 and N2 employ double well structures in which an N type well 12 is formed in a P type substrate 11, and P type wells 14 and 16 are formed in this N type well. Then, source and drain layers (18 and 20) are formed in the P type well 14, and source and drain layers (22 and 24) are formed in the P type well layer 16.

A transistor shown in the left side of FIG. 2 corresponds to the transistor N1, whereas a transistor shown in the right side of FIG. 2 corresponds to the transistor N2. It should also be noted that a substrate bias of the transistor N1 implies a voltage of the P type well 14 in FIG. 2. As will be explained later, a size of the differential pair transistor N may be preferably made larger than a size of the differential pair transistor N2 (this size aspect will be discussed with reference to FIG. 6 and FIG. 7).

Next, referring to FIG. 3 to FIG. 7, a description is made of operations executed when the offset of the comparator (comparing circuit) according to the first embodiment of the present invention, shown in FIG. 1. It should be understood that although circuits indicated in FIG. 3 to FIG. 6 are the same as the circuit of FIG. 1, these circuits are formed for the sake of easier understanding than that of FIG. 1. As a consequence, in FIG. 3 to FIG. 6, the constant current source transistors (N3 and N4) of FIG. 1 are illustrated in a simple manner as constant current sources (ISW1 and ISW2), respectively. Also, will be explained later, it is desirably set that the size (namely, channel conductance of MOS transistor: W/L) of the differential pair transistor N1 is made larger than the size of the differential pair transistor N2, for instance, the size of this differential pair transistor N2 is made two times larger than that of the differential pair transistor N1.

Figure 3:
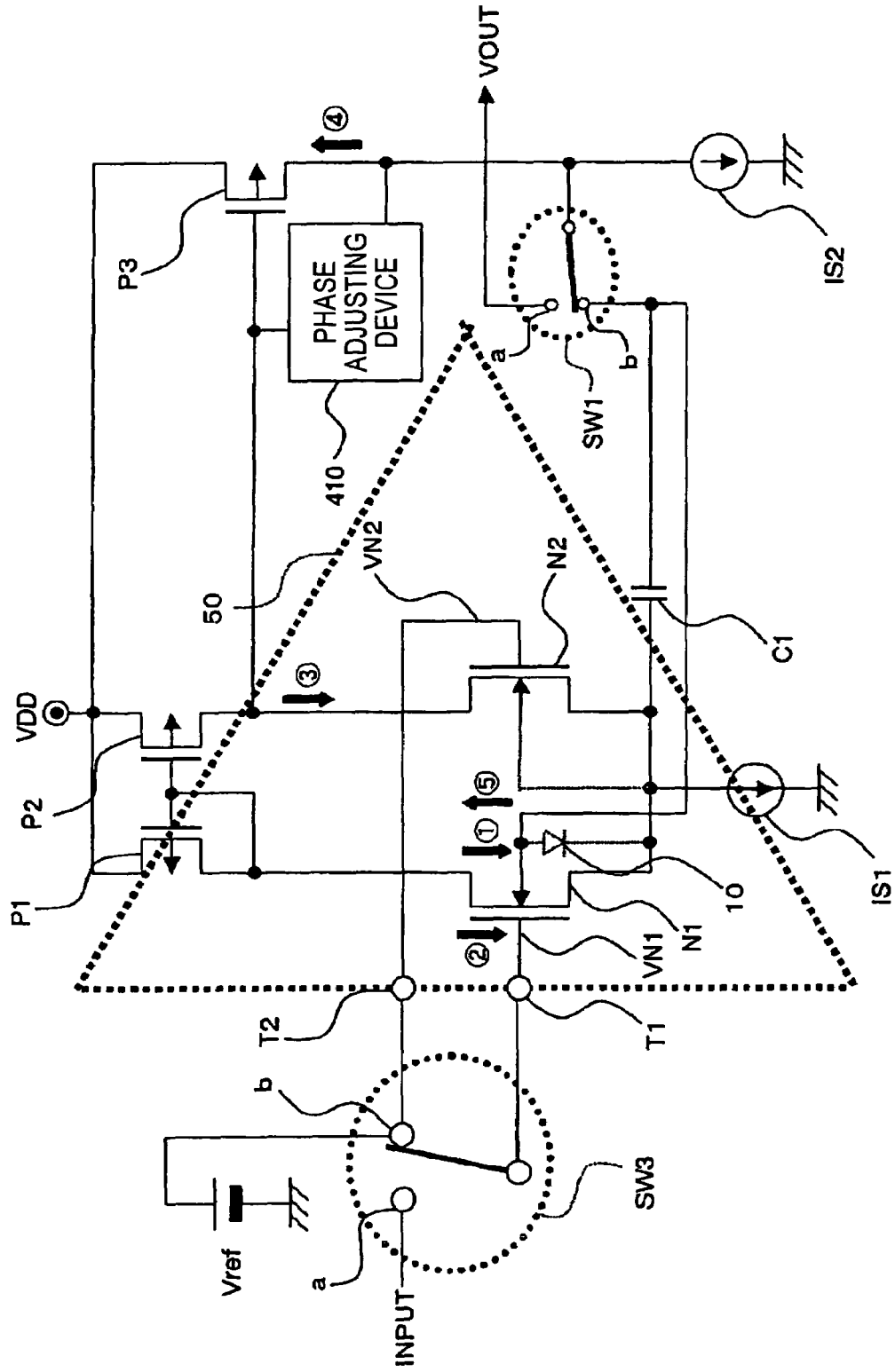
FIG. 3 is a circuit diagram for explaining a reference potential adjusting operation of the comparing circuit according to the first embodiment.

As shown in FIG. 3, the switch SW1 is switched to the b-terminal side in the offset adjusting mode. As a result, gate voltages "Vin1" and "Vin2" of the differential pair transistors N1 and N2 are fixed to a reference voltage "Vref." As previously explained, a current amount of a left side of a differential circuit is identical to a current amount of a right side of this differential circuit in view of logic values. However, in an actual case, these current amounts become unbalance due to various factors. In accordance with this first embodiment, the current amounts are automatically adjusted in a direction along which this unbalanced current amount can be canceled, while this unbalance canceling adjustment may be realized by changing a substrate bias of a MOS transistor.

Before a concrete explanation is commenced, a description is made of a relationship between a threshold voltage "Vth" of a MOS transistor and a substrate bias. The threshold voltage "Vth" of the MOS transistor may be expressed by the below-mentioned formula (1):

$$Vth = 2\Phi B + \{2 \in SqNA(2\Phi B + VBS)\}^{1/2} Ci \quad (1)$$

In this formula (1), symbol "$\Phi B$" indicates a potential of the substrate, symbol "$\in S$" shows a dielectric constant of silicon, symbol "q" represents a unit electric charge, and also, symbol "Ci" indicates a gate capacitance.

The threshold voltage Vth depends upon the source potential VBS (namely, potential at source while substrate is employed as reference potential). The higher this source potential VBS becomes, the higher the threshold voltage (inverting voltage) Vth is increased.

In this case, such an operation that a source potential is increased while a substrate potential is fixed is equivalent to such an operation that the source potential is fixed so as to lower the substrate potential. Both operations imply that the threshold voltage Vth is increased based upon the above-described formula (1).

Various sorts of automatic offset adjusting operations will now be described with reference to FIG. 3 to FIG. 7.

(1) Substrate Potential Adjusting Operation:

First, a description is made of operations capable of automatically adjusting the substrate potential of the differential pair transistor (NMOS transistor: will be simply described as "transistor" hereinafter) N1 with reference to FIG. 3. In FIG. 3, in order to clearly understand a negative feedback operation, changes in voltages appeared at predetermined places within the comparing circuit are indicated by employing arrows to which reference numerals 1 to 5 are attached. It should be noted that an arrow pointed to an upper direction implies an ascent of a voltage, whereas an arrow pointed to a lower direction implies a descent of a voltage.

In the case of the comparator (when phase adjusting device 410 is turned ON, this comparator functions as operational amplifier) of FIG. 3, the substrate potential of the transistor N1 is not fixed. As a consequence, the substrate potential of the transistor N1 is not determined under initial condition, but is brought into an unstable condition.

Assuming now that the substrate potential of the transistor N1 is lower than the substrate potential of the transistor N2 (see arrow 1 of FIG. 3), as previously explained, the threshold voltage Vth of the transistor N1 is increased. As a result, a current capability of the transistor N1 becomes lower than a current capability of the transistor N2.

Under this condition, the gate voltage (VN1) of the transistor N1 is equal to such a condition that this gate voltage (VN1) is lower than the gate voltage (VN2) of the transistor N2 (arrow 2 of FIG. 3). As a result, since a phase relationship between an input signal and an output signal of a differential amplifying circuit 50 (indicated by triangular wide line in FIG. 3) is established an in-phase condition, the voltage of the output signal from the differential amplifying circuit 50 is also lowered (arrow 3 shown in FIG. 3).

A voltage level of the output signal of the differential amplifier 50 is inverted at a source-grounded PMOS transistor (P3). As a consequence, a level of an output voltage of the source-grounded PMOS transistor (P3) is increased (reference numeral 4 in FIG. 3). At the present time, the switch SW1 has been switched to the b-terminal side, so that the output voltage of the source-grounded PMOS transistor (P3) is fed back as the substrate bias of the differential pair transistor N1 employed in the differential amplifying circuit 50.

As a result, the output voltage of the source-grounded PMOS transistor (P3) may directly constitute a substrate potential of the differential pair transistor N1. As a consequence, the substrate potential of the transistor N1 is increased (reference numeral 5 shown in FIG. 3). Since this operation is repeatedly carried out, the substrate potential of the transistor N1 becomes equal to the substrate potential of the transistor N2 and thus becomes stable. This operation implies that the substrate potential of the transistor N1 is adjusted in such a manner that a left-sided circuit system (namely, transistors P1 to N1 circuit system) of the differential amplifying circuit, and a right-sided circuit system (namely, transistors P2 to N2 circuit system) thereof may have the same characteristics.

Figure 4:
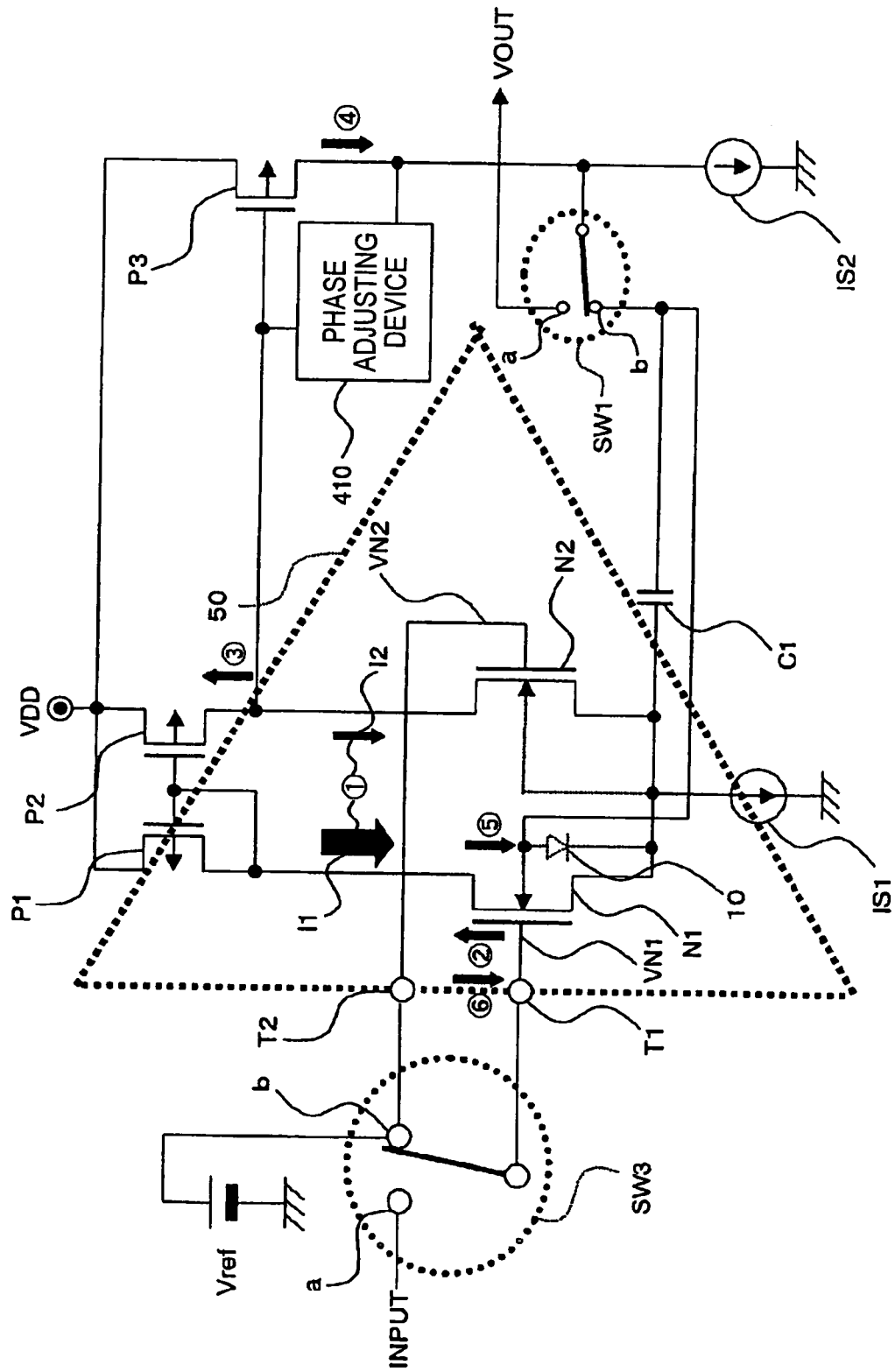
FIG. 4 is a circuit diagram for explaining a current capability offset adjusting operation of differential pair transistors employed in the comparing circuit according to the first embodiment.

(2) Operation for Adjusting Offset of Current Capability of Differential Pair Transistors:

There are many cases that offset occurs in the current capabilities of the differential pair transistors N1 and N2, which is caused by fluctuations produced when these transistors are manufactured. Referring now to FIG. 4, a description is made of operations for adjusting the offset of the current capabilities of the differential pair transistors.

In this offset adjusting operation, it is so assumed that the current capability of the differential pair transistor (left-sided transistor) N1 becomes higher than the current capability of the differential pair transistor (right-sided transistor) N2. In other words, as described in FIG. 4, a current amount of a current "I1" which flows through the left circuit system of the differential circuit is larger than a current amount of a current "I2" flowing through the right circuit system thereof (arrow 1 of FIG. 4).

Such a condition is identical to a condition in which the gate voltage of the transistor N1 is higher than the gate electrode of the transistor N2 (arrow 2 of FIG. 4). As a result, since a voltage level of a single ended output of the differential circuit is increased (arrow 3 in FIG. 4), a level of an output signal of the source-grounded transistor P3 is lowered (arrow 4 in FIG. 4). The output voltage of this source-grounded transistor P3 directly becomes the substrate potential of the differential pair transistor N1. Therefore, the substrate potential of this differential pair transistor N1 is lowered (arrow 5 in FIG. 4). As a result, the threshold voltage Vth of the transistor N1 is increased, so that the current capability of the transistor N1 is lowered.

This lowering of the current capability is essentially identical to lowering of the gate voltage of the differential pair transistor N1 (arrow 6, in FIG. 4). When such a negative feedback operation is repeatedly carried out and then both the transistors N1 and N2 become the same characteristics, the circuit condition may become stable. This implies that the substrate potential of the differential pair transistor N1 may be adjusted in such a manner that both the left-sided circuit system and the right-sided circuit system of the differential circuit become the same characteristics under such a condition that the gate voltage of the differential pair transistor N1 is equal to the gate voltage of the differential pair transistor N2.

Figure 5:
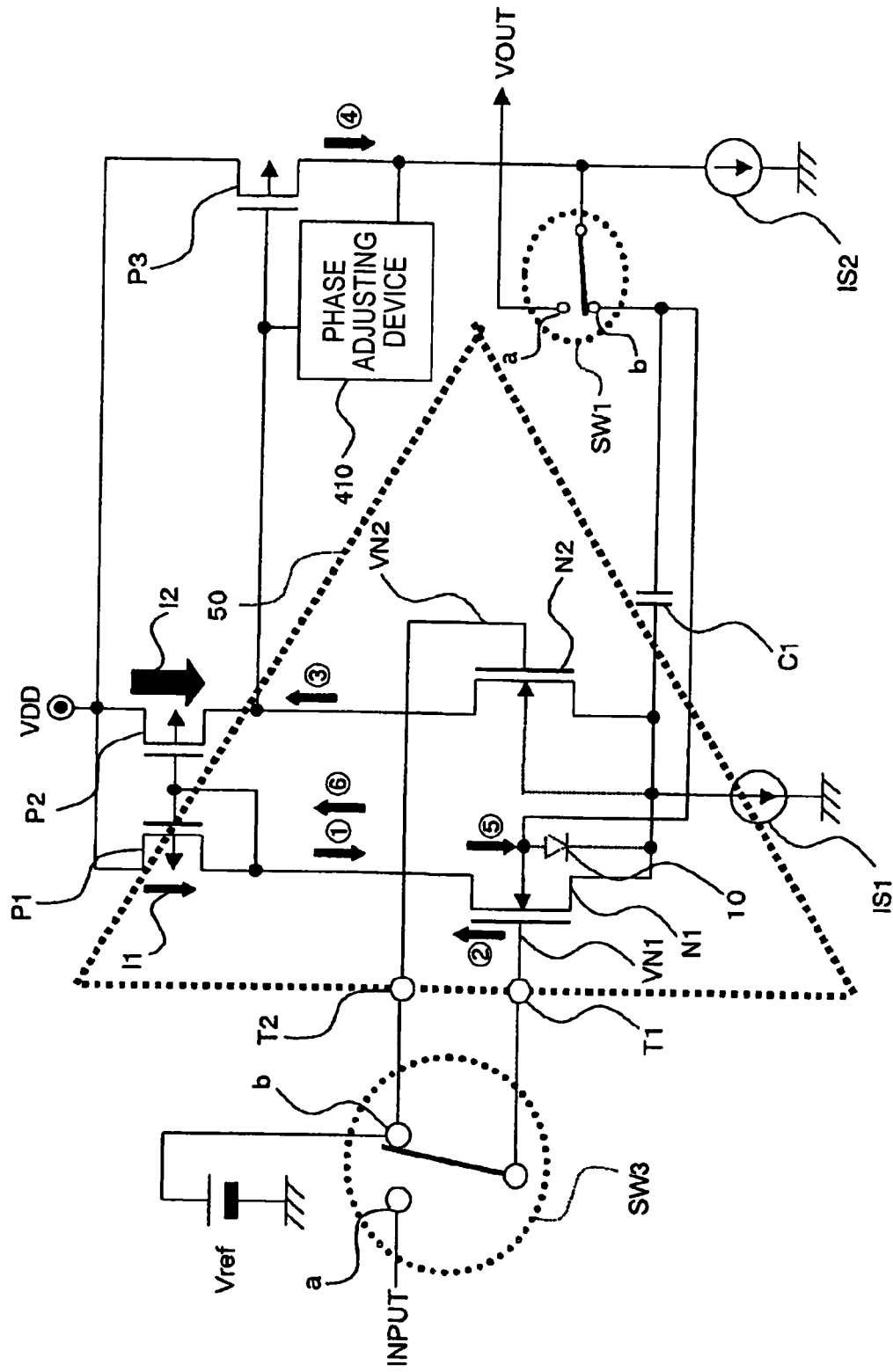
FIG. 5 is a circuit diagram for explaining a current offset adjusting operation of a current mirror employed in the comparing circuit according to the first embodiment.

(3) Adjusting Operation of Current Offset of Current Mirror:

Next, it is so assumed that a current capability of the transistor "P1" is lower than a current capability of the transistor "P2", while the transistor P1 and the transistor P2 constitute the current mirror. FIG. 5 is an explanatory diagram for explaining an adjusting operation of current offset of the current mirror in this assumption case.

Such an operation that a current "I1" flowing through the transistor P1 is smaller than another current "I2" flowing through the transistor P2 implies that under the condition that both the differential pair transistors N1 and N2 conduct the same amounts of the currents, a supply of a current from a power supply potential VDD in the left-sided circuit system is smaller than that of the right-sided circuit system.

As a result, a drain voltage of the transistor P1 becomes lower than a drain voltage of the transistor P2 (arrow 1 in FIG. 5). In other words, such a condition is made that the drain voltage of the differential pair transistor N1 become lower than the drain voltage of the differential pair transistor N2. This condition is identical to a condition in which a gate voltage of the transistor N1 becomes higher than the gate voltage of the transistor N2 (arrow 2 in FIG. 5).

Accordingly, a voltage level of a single ended output signal of the differential circuit is increased (arrow 3 in FIG. 5). As a consequence, a voltage level of an output signal of the source-grounded transistor P3 is lowered (arrow 4 in FIG. 5). As a result, a substrate potential of the transistor N1 is lowered (arrow 5 in FIG. 5). If the substrate potential of the transistor N1 is lower than a substrate potential of the transistor N2, then the threshold voltage Vth of the transistor N1 is increased, and the current capability of the transistor N1 is lowered. If the current capability of the transistor N1 is lowered, the drain voltage of the differential pair transistor N1 is increased. In other words, the drain voltage of the transistors which constitutes the current mirror is increased (arrow 6 in FIG. 5).

As previously explained, in such a case that both the transistors P1 and P2 own the different characteristics from each other, or even in such a case that the transistors N1 and N2 own the different characteristics from each other, the substrate potential of the differential pair transistor N1 is automatically adjusted in such a manner that the characteristic of the left-sided circuit system (circuit system containing transistors P1 and N1) of the differential circuit is identical to the characteristic of the right-sided circuit system (circuit system containing transistors P2 and N2) thereof under such a condition that the gate voltage of the differential pair transistor N1 is equal to the gate voltage of the differential pair transistor N2 (Vin1=Vin2).

In the above-described explanation, there is such a condition that the input levels of the differential pair transistors N1 and N2 are made equal to each other. As a consequence, under such a condition that the input levels with respect to the differential circuit are made equal to each other, the current offset of the current mirror may be automatically adjusted in such a manner that both the left current offset and the right current offset of the differential circuit become zero.

Figure 6:
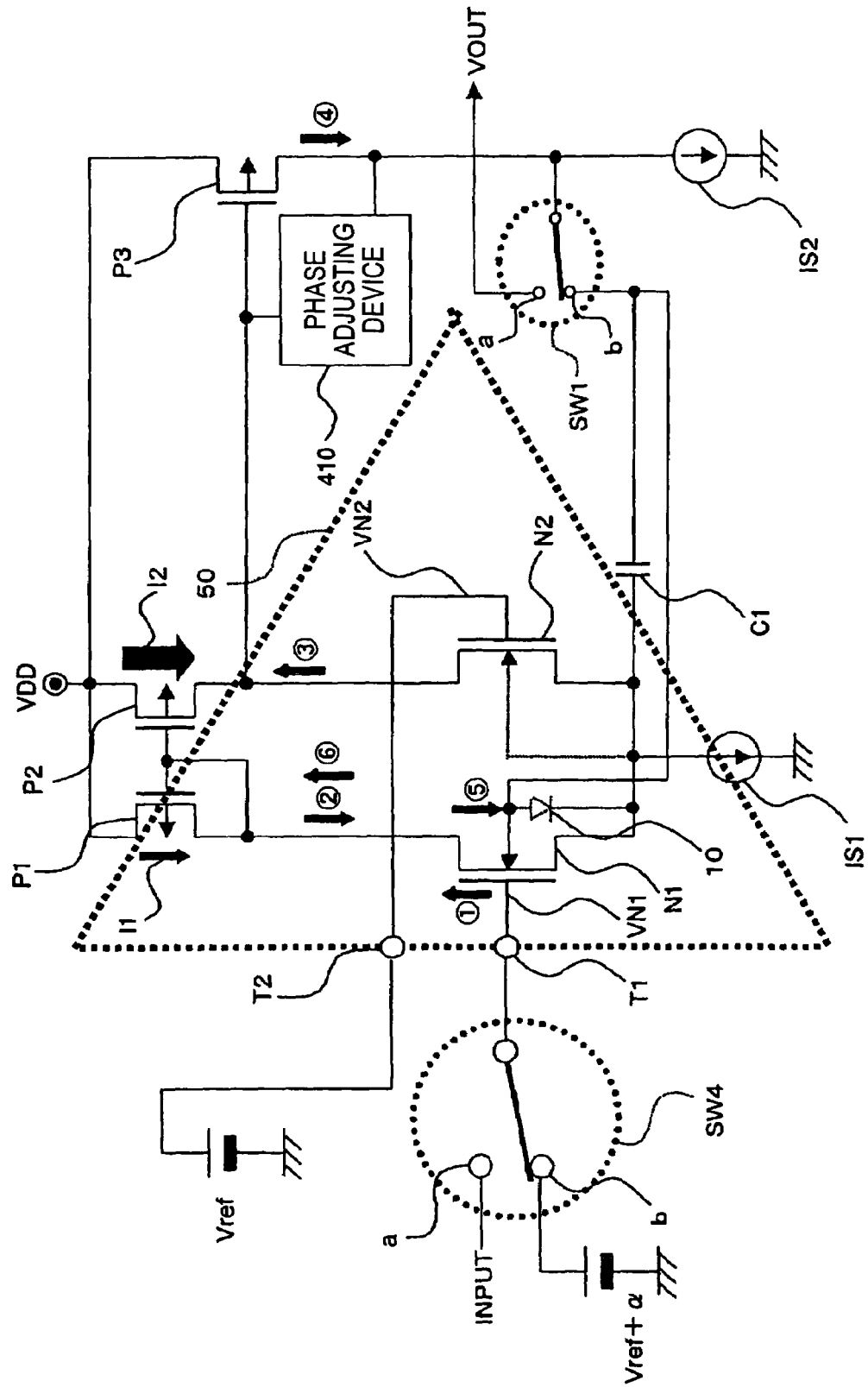
FIG. 6 is a circuit diagram for describing an adjusting operation for a substrate potential of a transistor N1 employed in the comparing circuit according to the first embodiment.

(4) Adjusting Operation of Substrate Potential of Transistor N1 in Case that Offset is Applied to Levels of Two Input Signals of Differential Circuit:

Next, such a case is assumed that while offset is applied to input signals of the differential pair transistors (N1 and N2), the input signal VN1 of the differential pair transistor N1 is higher than the input signal VN2 of the differential pair transistor N2. FIG. 6 is a circuit diagram for explaining an offset adjusting operation of this case.

Such a condition that the input signal VN1 of the transistor N1 is higher the input signal VN2 of the transistor N2 corresponds to such a condition that the transistor N1 conducts a larger current from a current of the transistor N2 (arrow 1 in FIG. 6). In other words, a drain voltage of the transistor N1 is lowered (arrow 2 in FIG. 6). As a result, a voltage level of a single ended output signal of the differential circuit is increased (arrow 3 in FIG. 6).

As a consequence, a level of an output signal from the source grounded transistor P3 is lowered (arrow 4 in FIG. 6). The output voltage of the transistor P3 directly constitutes a substrate potential of the differential pair transistor N1. Therefore, the substrate potential of the transistor N1 is lowered (arrow 5 in FIG. 6). As a result, a threshold voltage Vth of the transistor N1 is increased, so that the current capability of the transistor N1 is lowered.

As previously explained, in such a case that the input signals of the transistors N1 and N2 are different from each other, the substrate potential of the differential pair transistor N1 is automatically adjusted in such a manner that the characteristic of the left-sided circuit system (circuit system containing transistors P1 and N1) of the differential circuit is identical to the characteristic of the right-sided circuit system (circuit system containing transistors P2 and N2) thereof under such a condition that the gate voltage of the differential pair transistor N1 is different from the gate voltage of the differential pair transistor N2 (Vin1+α=Vin2)

As apparent from the above-described operation, when it is so considered that the gate voltage Vin2 is used as the reference voltage (Vin2=Vref), a difference (+α) of the voltage signal (Vref+α) inputted to Vin1 can be held as the offset. In other words, after this offset adjusting mode has been made effective, when both the switches SW1 and SW4 are connected to the a-terminal sides and then the normal operation mode is made effective, the offset (+α) is added to the input signal (Vref) of Vin2. Thus, it seems as if the comparing operation by the comparator were such a comparing operation executed between (Vref+α) and (Vin2). This implies that such a comparing operation can be carried out which is equivalent to a direct comparing operation between the signal inputted to Vin1 in the offset adjusting mode and the signal inputted to Vin1 in the normal operating mode.

(5) Adjusting Operation of Substrate Potential of Transistor N1 in Case that Offset is Applied to Differential Circuit in Order Not to Turn on Stray Diode:

In this first embodiment, such an offset intentionally applying method from the initial condition is actively utilized which is similar to the above-explained adjusting operation of the substrate potential of the transistor N1 in the case that the offset is applied to the levels of the two input signals of the above-described differential circuit (4).

In other words, the size of the transistor N1 is designed to be made larger than the size of the transistor N2 so as to apply a difference to the current capabilities of these transistors N1 and N2 from the beginning stage. As a result, it is possible to prevent the turn-ON operation of the stray diode, and the substrate potential of the transistor N1 can be varied along any one of the positive direction and the negative direction without any restriction.

Figure 7:
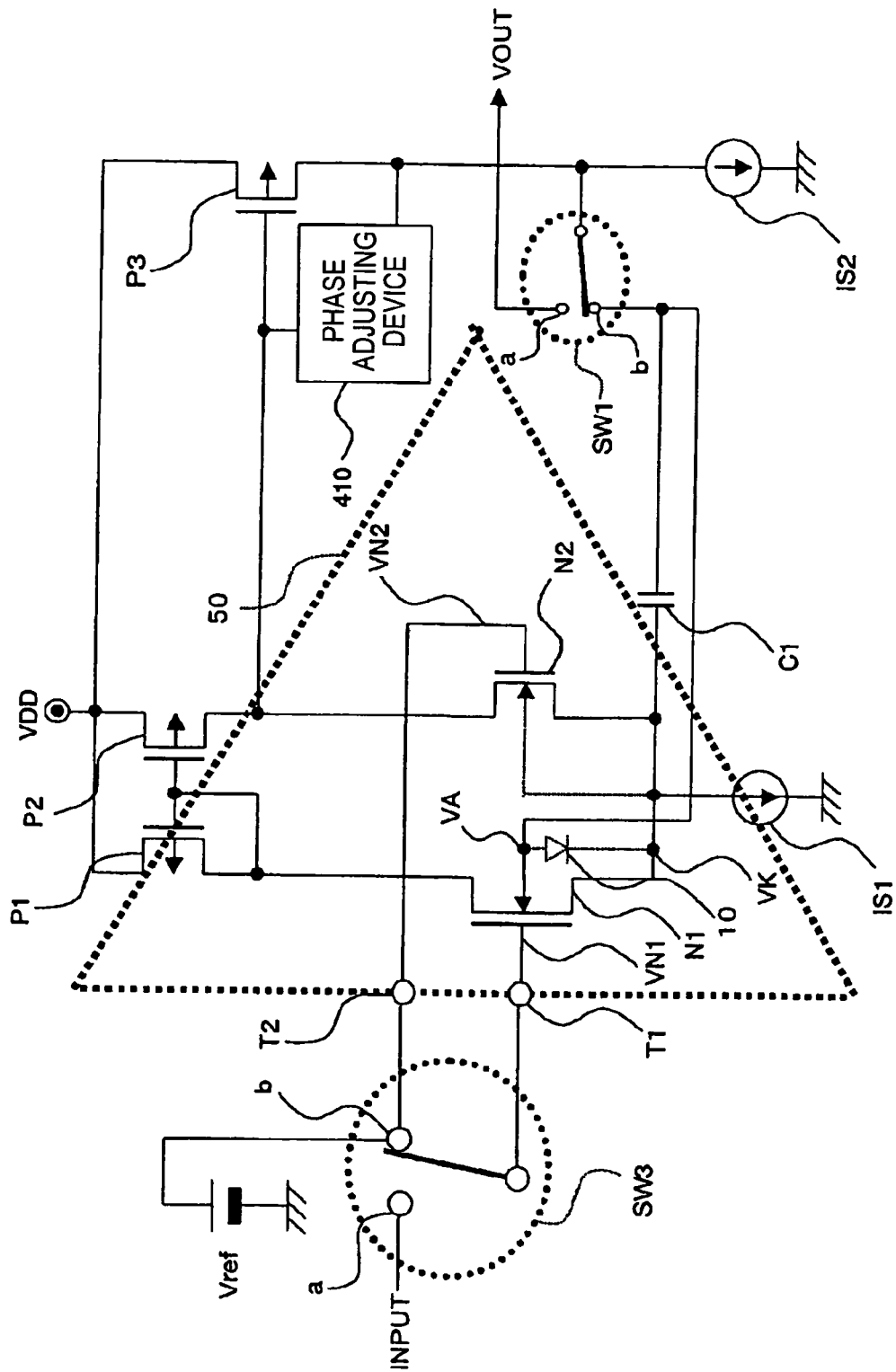
FIG. 7 is a circuit diagram for explaining an adjusting operation for a substrate potential of the transistor N1 in the case that offset is applied to an operating circuit of the comparing circuit according to the first embodiment.

Such a designing operation that the size of the transistor N1 is made larger than the size of the transistor N2 implies such an operation that under the above-described condition of "Vin1−α=Vin2", the gate voltage "Vin1" is forcibly made equal to the gate voltage "Vin2" (namely, Vin1−Vin2), and the offset of "−α" is applied to an output voltage of the source-grounded transistor P3 from the initial condition. Referring now to FIG. 7, a concrete explanation will be made an follows:

As indicated in FIG. 7, the size of the differential pair transistor N1 is made two times larger than the size of the differential pair transistor N2. It is so assumed that the substrate potential of the differential pair transistor N1 is increased by way of a negative feedback control in order to adjust an unbalance condition between a right-sided current and a left-sided current of the differential circuit.

At this time, if a stray capacitance 10 (see FIG. 7) interposed between the substrate and the source is turned ON, then the substrate potential is clamped by such a voltage (namely, VK+VF) which is produced by adding a forward-direction voltage "VF" to a source potential "VK" of the transistor N1, so that the substrate potential cannot be increased higher than, or equal to this clamped potential. Under this condition, the current adjusting capability of the MOS transistor utilizing the substrate bias effect may become imperfect.

In order to avoid such an event, in the example of FIG. 7, the sizes (namely, channel conductance: N/L) of these differential pair transistors N1 and N2 are set to be, for example, a ratio of 2:1. This may imply that such an initial condition of "Vin1−α=Vin2" (symbol "α" being initial offset voltage) is applied between the input voltage "Vin1" of the transistor N1 and the input voltage "Vin2" of the other transistor N2.

In this case, as described above, the offset voltage of "−α" is generated at the output voltage (output voltage of source grounded transistor P3) "Vout." Since this offset voltage constitutes the substrate bias of the transistor N1, the substrate potential of the transistor N1 is received by such a negative feedback control that this substrate potential is continuously lowered by this offset voltage "−α" under the initial condition, as compared with such a case that the size of the transistor N1 is made equal to the size of the transistor N2.

In other words, as to the substrate potential "VA" of the NMOS transistor N1, the negative feedback control operation is exerted along only such a potential lowering direction (namely, minus direction) from the beginning stage. As a consequence, since the substrate potential "VA" (namely, anode potential of stray diode 10) of the NMOS transistor N1 is not increased from the source voltage "VK" (namely, cathode potential of stray diode 10), this stray diode 10 is not turned ON at all.

Figure 8:
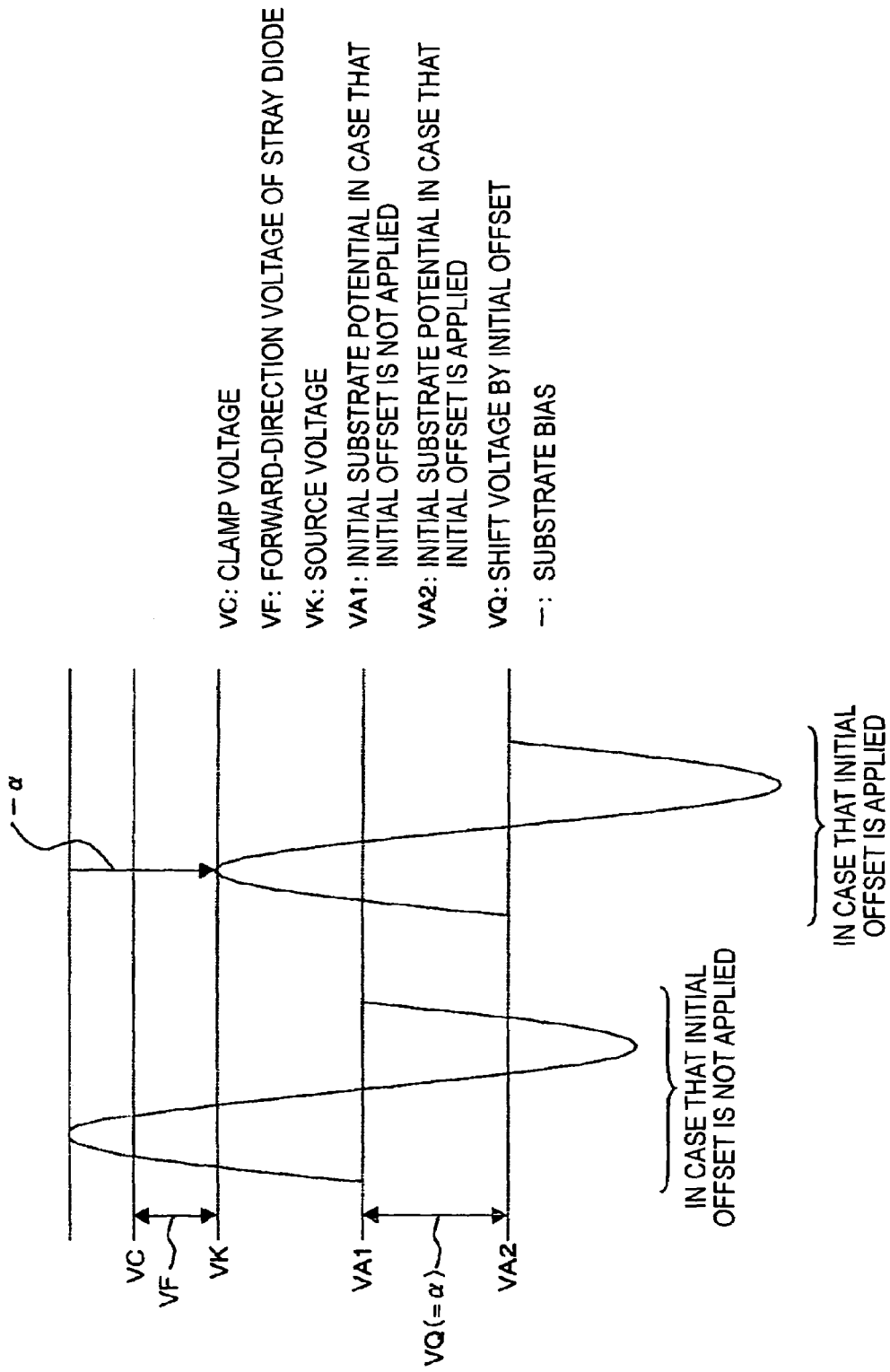
FIG. 8 is a diagram for indicating a mutual relationship among a substrate potential and a source potential of a transistor shown in FIG. 1, and a clamp potential.

FIG. 8 is a diagram for indicating a relationship among the substrate potential "VA" and the source voltage "Vk" of the NMOS transistor N1, and a clamp voltage. It should be understood that in this drawing, symbol "VC" indicates this clamp voltage; symbol "VF" shows a forward-direction voltage of the stray diode 10; symbol "Vk" represents the source voltage; symbol "VA1" denotes an initial substrate potential in the case that the initial offset voltage is not applied; symbol "VA2" represents another initial substrate potential in the case that the initial offset voltage is applied; symbol "VQ" shows a shifting voltage caused by the initial offset voltage; and symbol "−" indicates a substrate bias. A left-sided diagram portion of FIG. 8 indicates a change in the substrate biases in the case that the initial offset voltage "α" is not applied. When the substrate bias is increased, the substrate potential is clamped by the clamp voltage VC (VK+VF), so that this substrate bias cannot be changed higher than, or equal to this clamp voltage VC.

On the other hand, in the case that the initial offset voltage "α" is applied, since the substrate potential is shifted by the shifting voltage "VQ" (equivalent to above-explained offset voltage "α") to the minus side from the beginning stage, even when the substrate bias is sufficiently swung over the dynamic rage in a full scale, the stray diode 10 is not turned ON. Therefore, the substrate potential is not clamped. In other words, since there is no clamping risk caused by the stray diode 10, the signal level of the negative feedback control signal may be changed within the predetermined dynamic range, while no limitation is given to this signal level. As a consequence, the substrate bias adjustment can be continuously carried out by way of the proper negative feedback control operation.

It should also be noted that similar to the circuit of FIG. 1, a capacitor "C1" shown in FIG. 7 may function as a DC cutoff capacitor, and also may function as a holding capacitor. This DC cutoff capacitor is capable of avoiding that the substrate bias of the NMOS transistor N1 gives no advance influence to either the source potential or the substrate potential of the NMOS transistor N2. The holding capacitor is capable of continuously applying the adjusted voltage to the substrate of the NMOS transistor N1 for at least a predetermined time period even after the switches SW1 and SW3 are switched to the a-terminal sides after the offset adjusting operation has been completed.

In accordance with the first embodiment, since the offset of the comparator itself is added to the reference signal, the adverse influence of the offset caused by the manufacturing fluctuations of the transistors during the comparing operation can be eliminated, and thus, the comparing operations can be carried out in higher precision.

Figure 9:
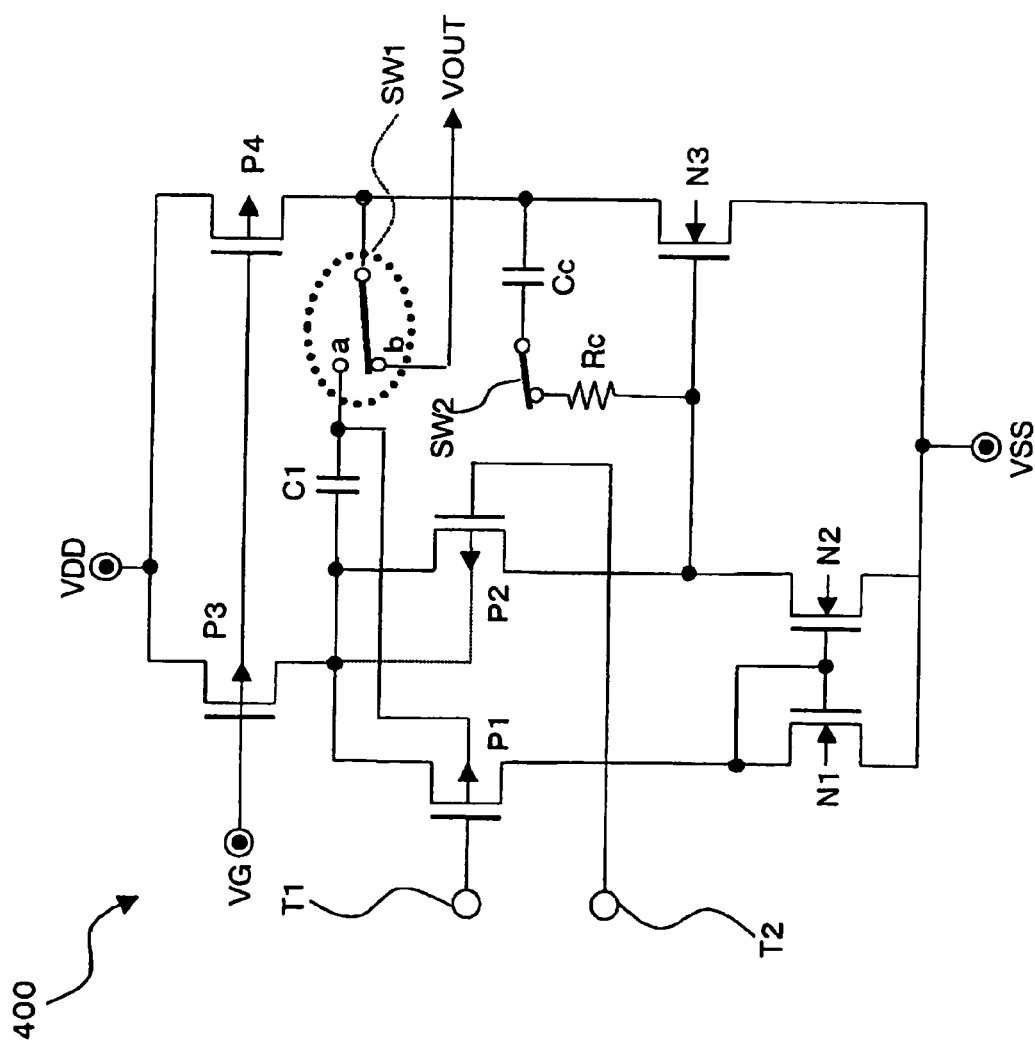
FIG. 9 is a circuit diagram for showing such an arrangement that the differential pair of the comparing circuit shown in FIG. 1 is constructed of PNP transistors.

FIG. 9 is a circuit diagram for indicating a comparator in which transistors constituting a differential pair of an input stage are arranged by PMOS transistors. Although conductivity types of these transistors employed in FIG. 9 are selected to be opposite to those of the transistors employed in FIG. 1 to FIG. 7, a basic operation of this comparator shown in FIG. 9 is the same as that of other comparators indicated in FIG. 1 to FIG. 7. A circuit operation of this comparator shown in FIG. 9 is similar to those of other comparators indicated in FIG. 1 to FIG. 7, and may have a similar effect to those of other comparators.

Second Embodiment Mode

Figure 10:
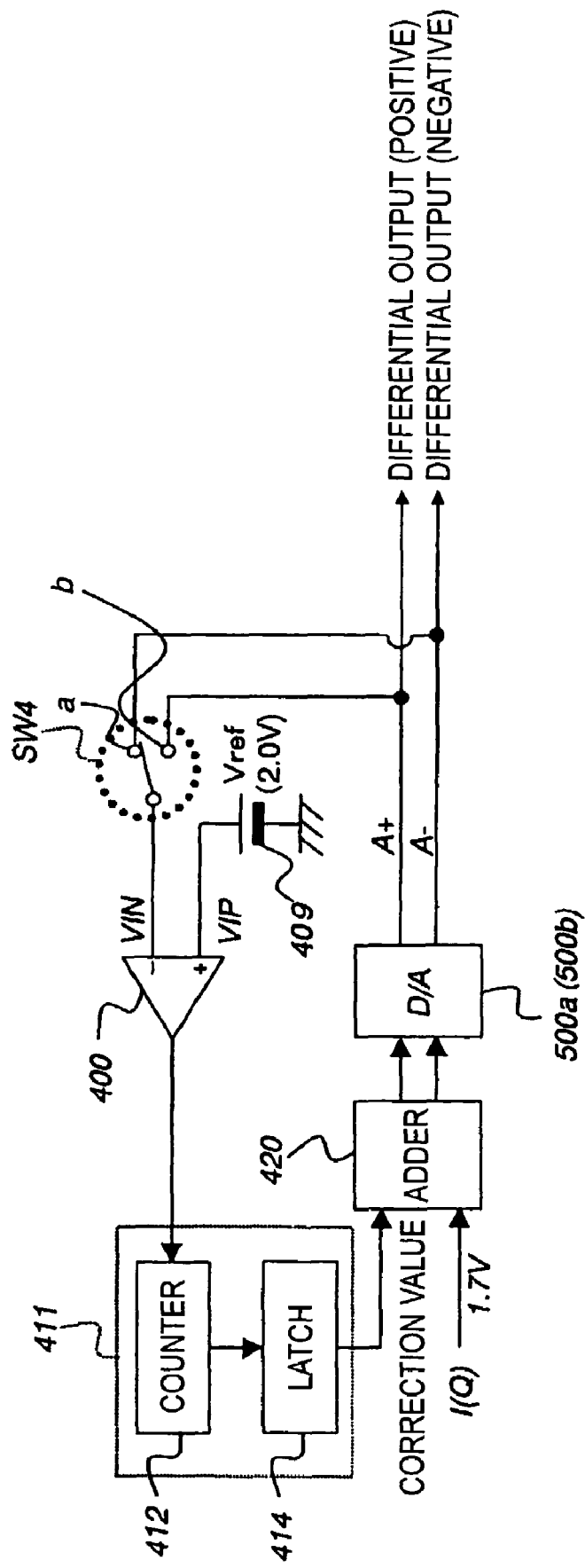
FIG. 10 is a circuit diagram for showing an arrangement of an offset compensating apparatus according to a second embodiment of the present invention.

FIG. 10 is a circuit diagram for showing an arrangement of an offset compensating apparatus according to a second embodiment mode of the present invention. The offset compensating apparatus of this second embodiment may cancel DC offset by employing a comparator having an offset adjusting function.

In this second embodiment, as the comparator, the comparator 400 equipped with the offset adjusting function as explained in the above-described first embodiment is used. Prior to canceling of offset of a D/A converter 500a (500b), a switch SW4 which is provided in an input stage of the comparator 400 is switched to an "a"-terminal side so as to adjust right/left current offset. A differential output (negative) of the D/A converter 500a (500b) is entered to this "a"-terminal.

As a result, comparison voltages used in the comparator 400 correspond to a reference voltage "Vref" connected to a noninverting terminal of this comparator 400, and the differential output (negative) of the D/A converter 500a (500b) which is connected to an inverting terminal of this comparator 400, and have no mutual relationship. Accordingly, this may become equal to such a case that the offset is applied to the differential pair transistors of the comparator as explained in the above-described first embodiment, and may cause such an operation that a difference between the differential output (negative) and the reference voltage Vref is held by the comparator 400.

Next, the switch SW4 is switched from the "a"-terminal to the "b"-terminal. At this time, such an operation for canceling the input/output offset of the D/A converter 500a (500b) is simultaneously carried out within a time period during which an adjusted voltage is held in the capacitor C1 of the comparator circuit shown in FIG. 1 (FIG. 2 to FIG. 7) so as to adjust the offset of the comparator.

In other words, in the case that the input/output of the D/A converter 500a (500b) own the offset, such a correction value capable of canceling this offset is outputted from a correction value producing circuit 411, and then, this correction value is applied to the input signal in an adder 420.

Subsequently, an outline of operation capable of correcting the offset existed in the input/output of the D/A converter 500a (500b) will be explained. First of all, such a data corresponding to, for example, a DC signal of 1.7 V is inputted to the adder 420. At this time, a counter 412 starts to count up in synchronism with the data input of 1.7 V. A latch circuit 414 directly applies the count value outputted from the counter 412 to the adder 420 for a time duration until the output signal of the comparator 400 is inverted to a low level.

Since the correction value applied to the adder 420 corresponds to "0" in the beginning stage, the input data of 1.7 V is directly applied to the D/A converter 500a (500b). A converted output (analog signal) of this D/A converter 500a (500b) is supplied via the switch SW4 to the inverting terminal of the comparator 400, whereas the reference voltage Vref (2 V in this embodiment) is being applied to the noninverting terminal of the comparator 400.

When it is so assumed that an output "A−" of the D/A converter 500a (500b) is equal to 1.7 V, such an offset of −0.29 V corresponding to a difference between 1.71 V and the reference voltage Vref (2V) is held in the comparator 400. As a consequence, since the offset is applied from the potential of the noninverting terminal, a comparison is made of 2 V−0.29 V=1.71 V. At this time, in the case that another output "A+" is equal to 1.69 V, since the potential at the noninverting terminal seemingly becomes higher, the output of the comparator 400 is the high level. As a result, the count value of the counter 412 is applied to the adder 420 so as to be added to the input signal.

When a similar operation is repeatedly carried out and an output signal of the D/A converter 500a (500b) exceeds "Vref (2 V)+offset voltage (−0.29 V)=1.71 V", the output level of the comparator 400 is inverterd into a low level, so that the counter 400 is reset. Also, the counter output obtained at this time is latched by the latch 414. As a result, both the positive and negative differential outputs of the D/A converter 500a (500b) are united to the potential (1.71 V) of the output "A−" thereof, so that the offset is canceled.

In this case, when the voltage of the output "A−" is lower than the voltage of the output "A+" of this D/A converter 500a (500b), namely when the voltage of "A−"=1.65 V and the voltage of "A+"=1.71 V, since the output level of the comparator 400 becomes a low level, the adjusting function cannot become effective. As a consequence, in the stage for adjusting the output "A+", the normal 1.7-V data is not inputted, but the lower voltage (e.g., 0 V) data must be forcibly applied. To this end, a certain time duration required to cancel the offset must be secured.

In accordance with the second embodiment, since the comparator 400 having the high-precision comparing operation is employed so as to correct the DC offset of the D/A converter 500a (500b), this DC offset of the D/A converter 500a (500b) can be canceled in higher precision.

Third Embodiment Mode

Figure 11:
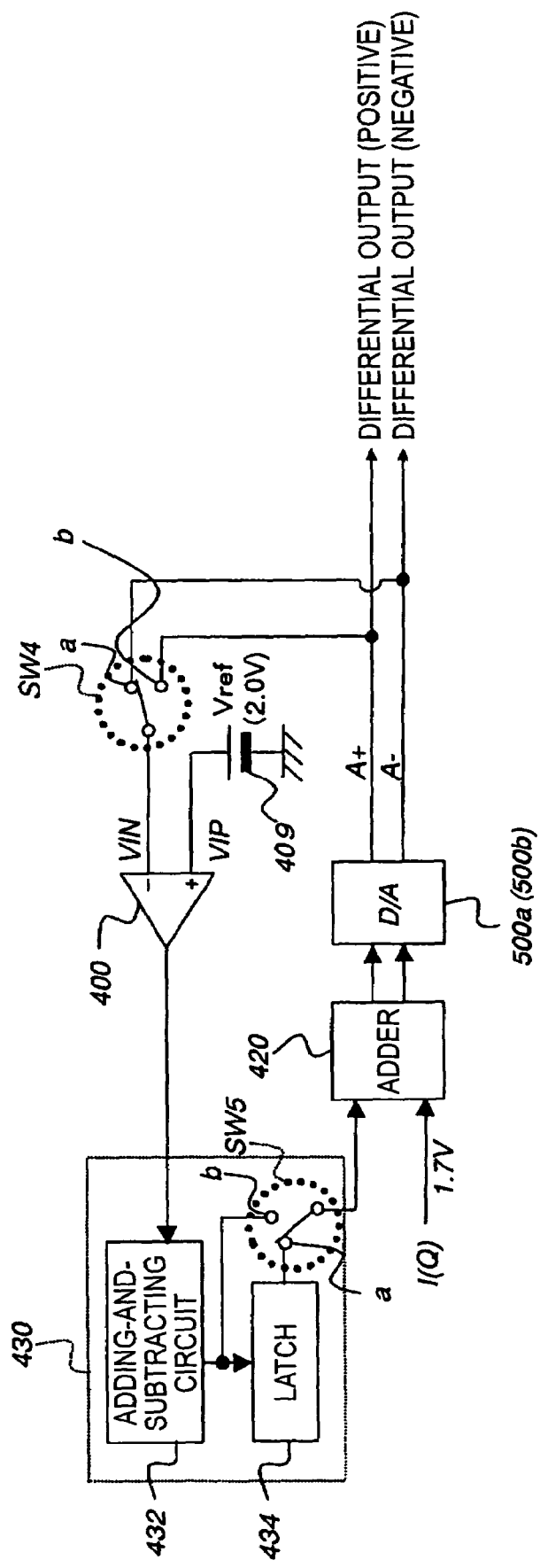
FIG. 11 is a circuit diagram for indicating an arrangement of an offset compensating apparatus according to a third embodiment of the present invention.

FIG. 11 is a circuit diagram for showing an arrangement of an offset compensating apparatus according to a third embodiment mode of the present invention. It should be understood that the same reference numerals shown in the second embodiment will be used for denoting the same, or similar circuit elements employed in the third embodiment. In the offset compensating apparatus of this third embodiment, a correction value producing circuit 430 is constituted by an adding-and-subtracting circuit (up/down counter) 432 and a latch 434, and as an input signal entered to an adder 420, any one of output signals derived from the adding-and-subtracting circuit 432 may be selected by a switch SW5. Other circuit arrangements of this offset compensating apparatus are similar to those of the circuit shown in FIG. 10.

In this embodiment, as the comparator, the comparator 400 equipped with the offset adjusting function as explained in the above-described first embodiment is employed. Prior to canceling of offset of a D/A converter 500a (500b), a switch SW4 which is provided in an input stage of the comparator 400 is switched to an "a"-terminal side so as to adjust right/left current offset. A differential output (negative) of the D/A converter 500a (500b) is entered to this "a"-terminal. Also, since the switch SW5 has been switched to the "b"-terminal side, the output of the adding-and-subtracting circuit 43 may be directly entered to the adder 42.

As a result, comparison voltages used in the comparator 400 correspond to a reference voltage "Vref" connected to a noninverting terminal of this comparator 400, and the differential output (negative) of the D/A converter 500a (500b) which is connected to an inverting terminal of this comparator 400, and have no mutual relationship. Accordingly, this may become equal to such a case that the offset is applied to the differential pair transistors of the comparator as explained in the above-described first embodiment, and may cause such an operation that a difference between the differential output (negative) and the reference voltage Vref is held by the comparator 400.

Next, the switch SW4 switched from the "a"-terminal to the "b"-terminal. At this time, such an operation for canceling the input/output offset of the D/A converter 500a (500b) is simultaneously carried out within a time period during which an adjusted voltage is held in the capacitor C1 of the comparator circuit shown in FIG. 1 (FIG. 2 to FIG. 7) so as to adjust the offset of the comparator.

In other words, in the case that the input/output of the D/A converter 500a (500b) own the offset, such a correction value capable of canceling this offset is outputted from a correction value producing circuit 430, and then, this correction value is applied to the input signal in the adder 420.

Subsequently, an outline of operations of this offset compensating apparatus will now be described. First of all, such a data corresponding to, for example, a DC signal of 1.7 V is inputted to the adder 420. At this time, the adding-and-subtracting circuit 432 executes a calculating operation in synchronism with the data input of 1.7 V in response to an output of the comparator 400. In the case that a signal level outputted from the comparator 400 is a high level, the adding-and-subtracting circuit 432 performs an up-counting operation in a certain time interval, whereas in the case that a signal level outputted from the comparator 400 is a low level, the adding-and-subtracting circuit 432 performs a down-counting operation.

The correction value producing circuit 430 directly supplies a calculation value outputted from the adding-and-subtracting circuit 432 via the switch SW5 to the adder 420 while a sufficiently long time period has passed during which the offset cancel is converged. Since the correction value applied to the adder 420 corresponds to "0" in the beginning stage, the input data of 1.7 V is directly applied to the D/A converter 500a (500b).

A converted output (analog signal) of this D/A converter 500a (500b) is supplied via the switch SW4 to the inverting terminal of the comparator 400, whereas the reference voltage Vref (2 V in this embodiment) is being applied to the noninverting terminal of the comparator 400. When it is so assumed that an output "A−" of the D/A converter 500a (500b) is equal to 1.7 V, such an offset of −0.29 V corresponding to a difference between 1 71 V and the reference voltage Vref (2 V) is held in the comparator 400.

As a consequence, since the offset is applied from the potential of the noninverting terminal, a comparison is made of 2 V−0.29 V=1.71 V. At this time, in the case that another output "A+" is equal to 1.69 V, since the potential at the noninverting terminal seemingly becomes higher, the output of the comparator 400 is the high level. As a result, the calculation result of the adding-and-subtracting circuit 432 is applied via the switch SW5 to the adder 420 so as to be added to the input signal.

When a similar operation is repeatedly carried out and an output signal of the D/A converter 500a (500b) exceeds "Vref (2 V)+offset voltage (−0.29 V)=1.71 V", the output level of the comparator 400 is inverted into a low level. When the output level of the comparator 400 is inverted into the low level, the adding-and-subtracting circuit 432 starts its subtracting operation.

As previously explained, the adding operation and the subtracting operation are repeatedly carried out by 1.7 V, and then the offset cancel is converged at 1.7 V. At this timing, the switch SW5 is switched from the "b"-terminal to the "a"-terminal, so that the calculation output latched by the latch 434 is added into the adder 420. As a result, both the positive and negative differential outputs of the D/A converter 500a (500b) are united to the potential (1.71 V) of the output "A−" thereof, so that the offset is canceled.

In accordance with the third embodiment, when the voltage of the output "A−" is lower than the voltage of the output "A+" of this D/A converter 500a (500b), namely when the voltage of "A−"=1.65 V and the voltage of "A+"=1.71 V, since the adding-and-subtracting circuit 432 performs the down counting operation so as to execute a similar operation, the lower voltage (e.g., 0 V) data is not forcibly applied. As a result, only such an adjusting time for the offset error is merely required, so that the resultant offset canceling time can be made shorter than that of the above-explained embodiment.

The above-explained second and third embodiments correspond to such a method that the output voltage "A−" of the D/A converter 500a (500b) is handled as the fixed value, whereas the output voltage "A+" thereof is adjusted. However, as employed in a current adding type D/A converter, there is another method that an output voltage "A+" and another output voltage "A−" must necessarily output an inverting relationship. It should be understood that the above-explained method of the second/third embodiments cannot be applied to such a current adding type D/A converter.

Fourth Embodiment Mode

Figure 12:
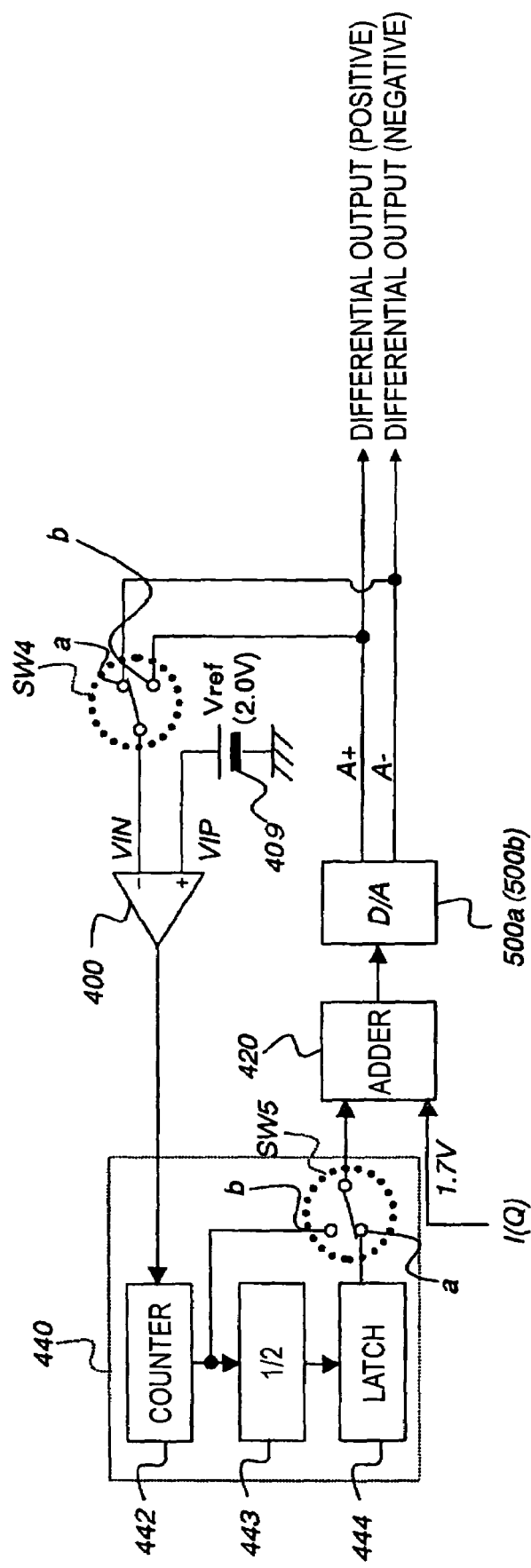
FIG. 12 is a circuit diagram for representing an arrangement of an offset compensating apparatus according to a fourth embodiment of the present invention.

FIG. 12 is a circuit diagram for showing an arrangement of an offset compensating apparatus according to a fourth embodiment mode of the present invention. It should be understood that the same reference numerals shown in the second embodiment will be used for denoting the same, or similar circuit elements employed in the fourth embodiment. In the offset compensating apparatus of this fourth embodiment, a correction value producing circuit 440 is constituted by a ½ circuit 443, and a switch SW5. The ½ circuit 443 reduces a count value of a counter 442 by ½. The switch SW5 selects as an input signal entered to an adder 420, anyone of output signals derived from an adding-and-subtracting circuit 432 and a latch 434. Other arrangements of this offset compensating apparatus are similar to those of the circuit shown in FIG. 10.

Prior to canceling of offset of a D/A converter 500a (500b), a switch SW4 which is provided in an input stage of the comparator 400 is switched to an "a"-terminal side so as to adjust right/left current offset. A differential output (negative) of the D/A converter 500a (500b) is entered to this "a"-terminal of this switch SW4. Also, while the switch SW5 has been switched to the "b"-terminal side, an output signal of the adding-and-subtracting circuit 432 is directly entered to the adder 420.

In this case, comparison voltages used in the comparator 400 correspond to a reference voltage "Vref" connected to a noninverting terminal of this comparator 400, and the differential output (negative) of the D/A converter 500a (500b) which is connected to an inverting terminal of this comparator 400, and have no mutual relationship. Accordingly, this may become equal to such a case that the offset is applied to the differential pair transistors of the comparator as explained in the above-described first embodiment, and may cause such an operation that a difference between the differential output (negative) and the reference voltage Vref is held by the comparator 400.

Next, the switch SW4 is switched from the "a"-terminal to the "b"-terminal. At this time, such an operation for canceling the input/output offset of the D/A converter 500a (500b) is simultaneously carried out within a time period during which an adjusted voltage is held in the capacitor C1 of the comparator circuit shown in FIG. 1 (FIG. 2 to FIG. 7) so as to adjust the offset of the comparator.

In other words, in the case that the input/output of the D/A converter 500a (500b) own the offset, such a correction value capable of canceling this offset is outputted from a correction value producing circuit 440, and then, this correction value is applied to the input signal in an adder 420.

Subsequently, an outline of operations of this offset compensating apparatus will now be described. First of all, such a data corresponding to, for example, a DC signal of 1.7 V is inputted to the adder 420. At this time, the counter 442 starts an up-counting operation in synchronism with the data input of 1.7 V. The switch SW5 directly applies a count value outputted from the counter 442 to the adder 420 for a time period until the level of the output signal of the comparator 400 is inverted into a low level.

Since the correction value applied to the adder 420 corresponds to "0" in the beginning stage, the input data of 1.7 V is directly applied to the D/A converter 500a (500b). A converted output (analog signal) of this D/A converter 500a (500b) is supplied via the switch SW4 to the inverting terminal of the comparator 400, whereas the reference voltage Vref (2 V in this embodiment) is being applied to the noninverting terminal of the comparator 400.

When it is so assumed that an output "A−" of the D/A converter 500a (500b) is equal to 1.7 V, such an offset of −0.29 V corresponding to a difference between 1.71 V and the reference voltage Vref (2 V) is held in the comparator 400. As a consequence, since the offset is applied from the potential of the noninverting terminal, a comparison is made of 2 V−0.29 V=1.71 V. At this time, in the case that another output "A+" is equal to 1.69 V, since the potential at the noninverting terminal seemingly becomes higher, the output of the comparator 400 is the high level. As a result, the count value of the counter 442 is applied to the adder 420 so as to be added to the input signal.

When a similar operation is repeatedly carried out and an output signal of the D/A converter 500a (500b) exceeds "Vref (2 V)+offset voltage (−0.29 V)=1.71 V", the output level of the comparator 400 is inverterd into a low level, so that the counter 442 is reset. Also, the counter output obtained at this time is converted into a ½ value thereof by the ½ circuit 443, and then, this ½ value is latched by the latch 444 to be entered into the adder 420. At this time, the switch SW5 is switched to the "a"-terminal side.

In other words, since the output voltage "A+" is merely corrected only by a half value of the counted value, this output voltage "A+" becomes (1.71 V+1.69 V)/2=1.70 V. However, the output voltage "A−" is also inverse-corrected with respect to the corrected value of the output voltage "A+", i.e., (1.70 V−1.69 V=+0.01 V).

That is to say, the output voltage "A−" becomes 1.71 V−(+0.01 V)=1.70 V, and thus, becomes the same potential to that of the output voltage "A+." As a result, both the positive and negative differential outputs of the D/A converter 500a (500b) are united to the potential (1.70 V), so that the offset is canceled.

In this case, when the voltage of the output "A−" is lower than the voltage of the output "A+" of this D/A converter. 500a (500b), namely when the voltage of "A−"=1.65 V and the voltage of "A+"=1.71 V, since the output level of the comparator 400 becomes a low level, the adjusting function cannot become effective. As a consequence, in the stage for adjusting the output "A+", the normal 1.7-V data is not inputted, but the lower voltage (e.g., 0 V) data must be forcibly applied. To this end, a certain time duration required to cancel the offset must be secured.

In accordance with this fourth embodiment, since the count value of the counter 442 is reduced by ½ and then the ½ reduced count value is finally latched to the latch 444. As to the output voltage "A+" and the output voltage "A−", even in such a case that the current adding type D/A converter 500a (500b) which necessarily and merely outputs the inverting relationship is employed, the symbol relationship is reversed, and a difference between the potential of the output voltage "A+" and the reference voltage "Vref" is held by the comparator, so that the offset can be canceled in high precision.

Fifth Embodiment Mode

Figure 13:
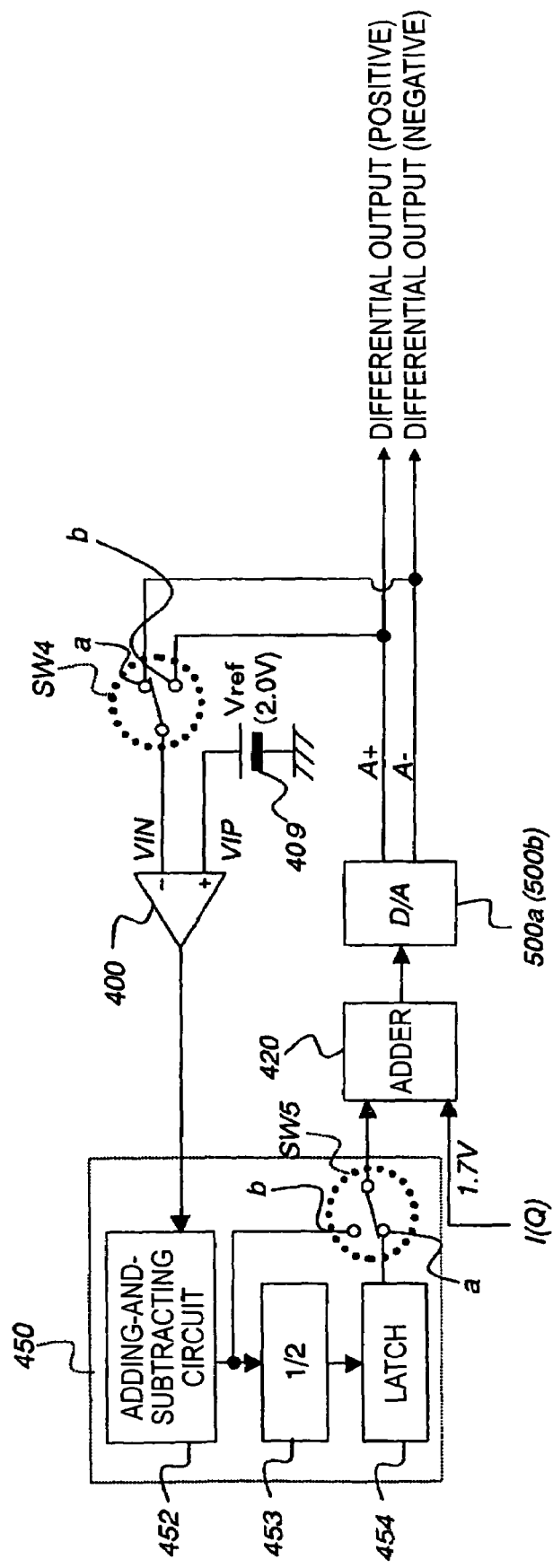
FIG. 13 is a circuit diagram for indicating an arrangement of an offset compensating apparatus according to a fifth embodiment of the present invention.

FIG. 13 is a circuit diagram for showing an arrangement of an offset compensating apparatus according to a fifth embodiment mode of the present invention. It should be understood that the same reference numerals shown in the second embodiment will be used for denoting the same, or similar circuit elements employed in the fourth embodiment. In the offset compensating apparatus of this fifth embodiment, a correction value producing circuit 450 contains a ½ circuit 443, and a switch SW5. The ½ circuit 443 reduces a count value of an adding-and-subtracting circuit (up/down counter) 452 by ½. The switch SW5 selects as an input signal entered to an adder 420, any one of output signals derived from an adding-and-subtracting circuit 432 and a latch 434. Other arrangements of this offset compensating apparatus are similar to those of the circuit shown in FIG. 10.

Prior to canceling of offset of a D/A converter 500a (500b), a switch SW4 which is provided in an input stage of the comparator 400 is switched to an "a"-terminal side thereof so as to adjust right/left current offset. A differential output (negative) of the D/A converter 500a (500b) is entered to this "a"-terminal of this switch SW4. Also, while the switch SW5 has been switched to the "b"-terminal side thereof, an output signal of the adding-and-subtracting circuit 452 is directly entered to the adder 420.

In this case, comparison voltages used in the comparator 400 correspond to a reference voltage "Vref" connected to a noninverting terminal of this comparator 400, and the differential output (negative) of the D/A converter 500a (500b)

which is connected to an inverting terminal of this comparator 400, and have no mutual relationship. Accordingly, this may become equal to such a case that the offset is applied to the differential pair transistors of the comparator as explained in the above-described first embodiment, and may cause such an operation that a difference between the differential output (negative) and the reference voltage Vref is held by the comparator 400.

Next, the switch SW4 is switched from the "a"-terminal to the "b"-terminal. At this time, such an operation for canceling the input/output offset of the D/A converter 500a (500b) is simultaneously carried out within a time period during which an adjusted voltage is held in the capacitor C1 of the comparator circuit shown in FIG. 1 (FIG. 2 to FIG. 7) so as to adjust the offset of the comparator.

In other words, in the case that the input/output of the D/A converter 500a (500b) own the offset, such a correction value capable of canceling this offset is outputted from a correction value producing circuit 450, and then, this correction value is applied to the input signal in an adder 420.

Subsequently, an outline of operations of this offset compensating apparatus will now be described. First of all, such a data corresponding to, for example, a DC signal of 1.7 V is inputted to the adder 420. At this time, the adding-and-subtracting circuit 452 executes an adding-and-subtracting operation in synchronism with the data input of 1.7 V. In the case that a signal level outputted from the comparator 400 is a high level, the adding-and-subtracting circuit 452 performs an up-counting operation, whereas in the case that a signal level outputted from the comparator 400 is a low level, the adding-and-subtracting circuit 452 performs a down-counting operation.

The switch SW5 directly supplies a calculation value outputted from the adding-and-subtracting circuit 452 via the switch SW5 to the adder 420 while a sufficiently long time period has passed during which the offset cancel is converged. Since the correction value applied to the adder 420 corresponds to "0" in the beginning stage, the input data of 1.7 V is directly applied to the D/A converter 500a (500b). A converted output (analog signal) of this D/A converter 500a (500b) is supplied via the switch SW4 to the inverting terminal of the comparator 400, whereas the reference voltage Vref (2 V in this embodiment) is being applied to the noninverting terminal of the comparator 400.

When it is so assumed that an output "A−" of the D/A converter 500a (500b) is equal to 1.7 V, such an offset of −0.29 V corresponding to a difference between 1.71 V and the reference voltage Vref (2 V) is held in the comparator 400. As a consequence, since the offset is applied from the potential of the noninverting terminal, a comparison is made of 2 V−0.29 V=1.71 V. At this time, in the case that another output "A+" is equal to 1.69 V, since the potential at the noninverting terminal seemingly becomes higher, the output of the comparator 400 is the high level. As a result, the calculation result of the adding-and-subtracting circuit 452 is applied via the switch SW5 to the adder 420 so as to be added to the input signal.

When a similar operation is repeatedly carried out and an output signal of the D/A converter 500a (500b) exceeds "Vref (2 V)+offset voltage (−0.29 V)=1.71 V", the output level of the comparator 400 is inverterd into a low level. As a result, the adding-and-subtracting circuit 452 repeats an adding operation and a subtracting operation at the voltage of 1.71 V, and the added/subtracted results are converged to 1.7 V. Also, the counter output obtained at this time is converted into a ½ value thereof by the ½ circuit 443, and then, this ½ value is latched by the latch 444 and is entered into the adder 420. At this time, since the switch SW5 is switched to the "a"-terminal side thereof, an output value of the adding-and-subtracting circuit 452 is converted into a ½ value of this output voltage by the ½ circuit 453, which is then latched by the latch 454, while properly considering this timing.

In other words, since the output voltage "A+" is merely corrected only by a half value of the counted value, this output voltage "A+" becomes (1.71 V+1.69 V)/2=1.70 V. However, the output voltage "A−" is also inverse-corrected with respect to the corrected value of the output voltage "A+", i.e., (1.70 V−1.69 V=+0.01 V). That is to say, the output voltage "A−" becomes 1.71 V−(+0.01 V)=1.70 V, and thus, becomes the same potential to that of the output voltage "A+" As a result, both the positive and negative differential outputs of the D/A converter 500a (500b) are united to the potential (1.70 V), so that the offset is canceled.

In this case, when the voltage of the output "A−" is lower than the voltage of the output "A+" of this D/A converter 500a (500b), namely when the voltage of "A−=1.65 V" and the voltage of "A+=1.71 V", since the same operation can be carried out, the lower voltage (e.g., 0 V) data need not be forcibly applied. As a result, only adjusting time required for adjusting the offset error may become sufficient.

In accordance with this fifth embodiment, since the count value of the counter 442 is reduced by ½ and then the ½ reduced count value is finally latched to the latch 444. As to the output voltage "A+" and the output voltage "A−", even in such a case that the current adding type D/A converter 500a (500b) which necessarily and merely outputs the inverting relationship is employed, the symbol relationship is reversed, and a difference between the potential of the output voltage "A+" and the reference voltage "Vref" is held by the comparator, so that the offset can be canceled in high precision. Also, since the adding-and-subtracting circuit 452 is employed, even in such a case that the voltage of the output "A−" is lower than the voltage of the output "A+", since a similar operation can be carried out, the lower voltage (e.g., 0 V) data need not be forcibly applied to the adder 420. As a result, since only the adjusting time for adjusting the offset error may become sufficient, the offset cancel time can be shortened.

As previously explained, in the second to fifth embodiments, since the comparator equipped the offset adding function is employed, the offset of the comparator itself is adjusted. As a result, the offset of the comparator can be handled as zero, and thus, the offset of the D/A converter 500a (500b) can be canceled in high precision.

Sixth Embodiment Mode

Figure 14:
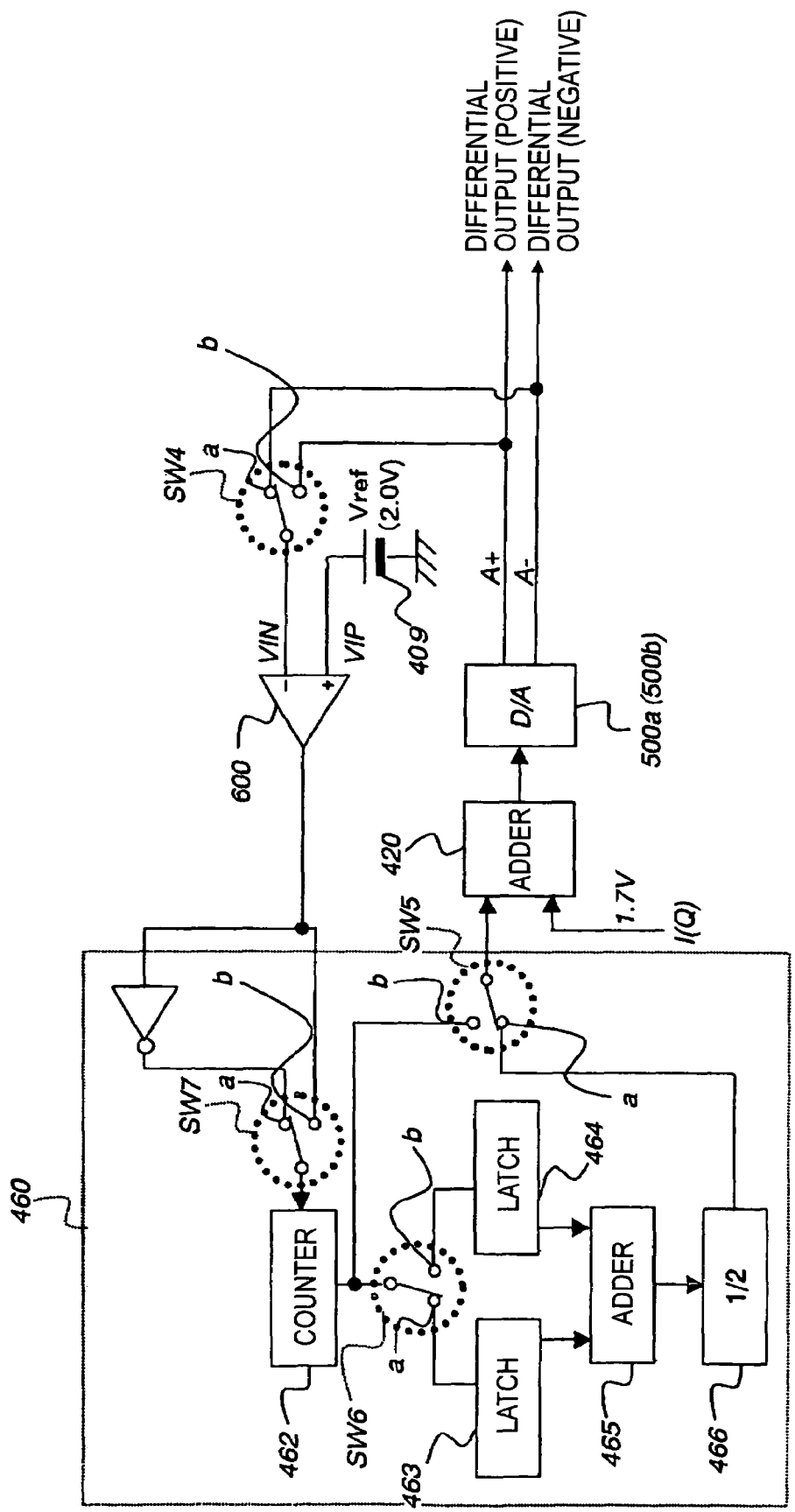
FIG. 14 is a circuit diagram for showing an arrangement of an offset compensating apparatus according to a sixth embodiment of the present invention.

FIG. 14 is a circuit diagram for showing an arrangement of an offset compensating apparatus according to a sixth embodiment mode of the present invention. It should be understood that the same reference numerals shown in the second embodiment will be used for denoting the same, or similar circuit elements employed in the sixth embodiment. In the offset compensating apparatus of this sixth embodiment, a correction value producing circuit 460 contains an inverter 461, a counter 462, latches 463 and 464, an adder 465, an ½ circuit 466, a switch SW5, another switch SW6, and another switch SW7. The inverter 461 inverts an output signal of a comparator 600. The switch SW5 switches any one of an output signal of the counter 462 and an output signal of the ½ circuit 466 as an input signal to the adder 420. The switch SW6 enters an output signal of the counter 462 to be selectively inputted to either the latch 463 or the latch 464. Then, the switch SW7 switches any one of an output signal of the comparator 600 and an inverted comparator output signal as an input signal to the counter 462. Also, while the comparator equipped with the offset adjusting function explained in the above-described first embodiment is not used as the comparator 600, other arrangements are similar to those of the first embodiment shown in FIG. 10 except that such a comparator is used that the offset is present during the normal comparing/measuring operation.

Prior to canceling of offset of a D/A converter 500a (500b), a switch SW4 which is provided in an input stage of the comparator 600 is switched to an "a"-terminal side thereof, and also, both the switch SW6 and the switch SW7 which are mutually operated with respect to the switch SW4 are switched to "a"-terminal sides thereof. However, the switch SW5 is switched to a "b"-terminal side thereof.

In this case, the comparator 600 compares the reference voltage Vref connected to a noninverting terminal thereof with a differential output (negative) signal of the D/A converter 500a (500b) connected to an inverting terminal thereof so as to perform an offset canceling operation as to the output voltage "A–" of the D/A converter 500a (500b). The offset canceling result is latched by the latch 463.

Next, the switches SW4, SW6, and SW7 are switched to the "b"-terminal sides thereof. At this time, the comparator 600 compares the reference voltage Vref connected to the noninverting terminal thereof with a differential output (positive) signal of the D/A converter 500a (500b) connected to the inverting terminal thereof so as to perform an offset canceling operation as to the output voltage "A+" of the D/A converter 500a (500b) The offset canceling result is latched by the latch 464.

After a series of the above-described process operations have been accomplished, the switch SW5 is switched to the "a"-terminal side thereof, and also, both the value latched by the latch 463 and the value latched by the latch 464 are added to each other by the adder 465. The added result is converted into a ½ of this added value by the ½ circuit 466, and thereafter, the ½ added value is inputted to the adder 420.

In other words, in such a case that the input/output of the D/A converter 500a (500b) contain offset, such a correction value capable of canceling this offset is outputted from the correction value producing circuit 460. Then, this correction value is applied to the input signal in the adder 420.

Subsequently, an outline of operations of this offset compensating apparatus will now be described. First of all, such a data corresponding to, for example, a DC signal of 1.7 V is inputted to the adder 420. At this time, the counter 462 starts an up-counting operation in synchronism with the data input of 1.7 V. The switch SW5 directly applies a calculation value outputted from the counter 462 to the adder 420 for a time period until the level of the output signal of the comparator 600 is inverted into a low level.

Since the correction value applied to the adder 420 corresponds to "0" in the beginning stage, the input data of 1.7 V is directly applied to the D/A converter 500a (500b). A converted output (analog signal) of this D/A converter 500a (500b) is supplied via the switch SW4 to the inverting terminal of the comparator 600, whereas the reference voltage Vref (2 V in this embodiment) is being applied to the noninverting terminal of the comparator 600.

When it is so assumed that an output voltage "A–" of the D/A converter 500a (500b) is equal to 2.05 V, the comparator 600 judges that this input voltage of 2.05 V is higher than the reference voltage Vref, and thus, an output signal level of this comparator 600 becomes a low level. Since the switch SW7 is connected to the "a"-terminal side, the low level output of the comparator 600 is inverted by the inverter 461 to become a high level which is then entered into the counter 462.

As a result, the counter 462 performs an up-counting operation, and then, the count value is supplied via the switch SW5 to be added by the adder 420. When it is so assumed that the D/A converter 500a (500b) corresponds to such a D/A converter as a current adding type D/A converter, both the differential output (positive) "A+" and differential output (negative) "A–" of which necessarily own the inverting relationship, the offset of the differential output "A–" to which the value has been added may be reduced. In other words, the output voltage "A–" of 2.05 V may be reduced.

Then, this operation is repeatedly carried out until the output signal level of the comparator 600 becomes a low level, namely the output voltage of "A–" becomes lower than the reference voltage Vref. In this embodiment, when it is so assumed that an analog output of the D/A converter 500a (500b) is equal to 0.02 V with respect to an increment of the counter 462 by 1, a series of these operations are accomplished at such a timing when the counter 462 counts 3 times. At the time when a series of these operations are ended, this count value 3 is latched by the latch 463.

Next, the switches SW4, SW6, and SW7 are connected to the "b"-terminal sides thereof. Then, a similar operation to the above-described operation is carried out. Now, when it is so assumed that the differential output voltage of "A+" is equal to 1.89 V, the comparator 600 judges that this input voltage of 1.89 V is lower than the reference voltage Vref, and thus, an output signal level of this comparator 600 becomes a high level. Since the switch SW7 is connected to the "b"-terminal side, the output level of the comparator 600 directly becomes a high level which is then entered into the counter 462. The counter 462 performs an up-counting operation, and this count value is supplied via the switch SW5 so as to be added in the adder 420.

As to the differential output (positive) "A+" of the D/A converter 500a (500b), the offset thereof is increased by this added value. That is to say, the voltage of 1.89 V is increased. Then, this operation is repeatedly carried out until the output signal level of the comparator 600 becomes a low level, namely the output voltage of "A–" becomes higher than the reference voltage Vref. In this embodiment, when it is so assumed that an analog output of the D/A converter 500a (500b) is equal to 0.02 V with respect to an increment of the counter 462 by 1, a series of these operations are accomplished at such a timing when the counter 462 counts 6 times. At the time when a series of these operations are ended, this count value 6 is latched by the latch 464.

Next, the switch SW5 is connected to the "a"-terminal side thereof, and further, both the values latched by the latches 463 and 464 are added to each other by the adder 465, and then, an added value is reduced by ½ in the ½ circuit 466 to obtain the ½ added value as a correction value. Thereafter, this correction value is entered to the adder 420. For example, the count value 3 of the latch 463 is added to the count value 6. of the latch 464 by the adder 465. An added value becomes 9, and this value 9 is reduced by ½ by the ½ circuit 466, so that a value of 4 is obtained as the correction value. Then, this correction value is added to the input signal by the adder 420. In this case, the differential output (positive) "A+" of the D/A converter 500a (500b) is corrected to become 1.97 V. Similarly, the differential output (negative) "A–" of this D/A converter 500a (500b) becomes 1.97 V, so that the offset may be canceled.

On the other hand, in this sixth embodiment, since the normal type comparator 600 is employed, this comparator 600 itself owns an offset error. A description is made of such a case that the comparator 600 owns such an offset error.

First of all, such a data corresponding to, for example, a DC signal of 1.7 V is inputted to the adder 420. At this time, the counter 462 starts an up-counting operation in synchronism with the data input of 1.7 V. The switch SW5 directly applies a calculation value outputted from the counter 442 to the adder 462 for a time period until the level of the output signal of the comparator 600 is inverted into a low level.

Since the correction value applied to the adder 420 corresponds to "0" in the beginning stage, the input data of 1.7 V is directly applied to the D/A converter 500a (500b). A converted output (analog signal) of this D/A converter 500a (500b) is supplied via the switch SW4 to the inverting terminal of the comparator 600, whereas the reference voltage Vref (2 V in this embodiment) is being applied to the noninverting terminal of the comparator 600.

Now, such an assumption is made that the offset of the comparator 600 is equal to −0.10 V. In the case that the differential output voltage "A−" is equal to 2.05 V, since the comparator 600 compares this differential output voltage "A−" is compared with (Vref−0.10 V=1.90 V), this comparator 600 judges that the differential output voltage "A−" becomes higher than 1.90 V, and thus an output level thereof becomes a low level.

Since the switch SW7 is connected to the "a"-terminal side thereof, the output signal level of the comparator 600 becomes a high level which is then entered to the counter 462. As a result, the counter 462 executes an up-counting operation, and then, the count value is supplied via the switch SW5 so as to be added to an I(Q) by the adder 420.

When it is so assumed that the D/A converter 500a (500b) corresponds to such a D/A converter as a current adding type D/A converter, both the differential output (positive) "A+" and differential output (negative) "A−" of which necessarily own the inverting relationship, the offset of the differential output "A−" to which the value has been added may be reduced. In other words, the output voltage "A−" of 2.05 V is reduced. Then, this operation is repeatedly carried out until the output signal level of the comparator 600 becomes a low level, namely the output voltage of "A−" becomes lower than 1.90 V. In this embodiment, when it is so assumed that an analog output of the D/A converter 500a (500b) is equal to 0.02 V with respect to an increment of the counter 462 by 1, a series of these operations is accomplished at such a timing when the counter 462 counts 8 times. At the time when a series of these operations are ended, this count value 8 is latched by the latch 463.

Next, the switches SW4, SW6, and SW7 are connected to the "b"-terminal sides thereof. Then, a similar operation to the above-described operation is carried out. Now, when it is so assumed that the differential output voltage of "A+" is equal to 1.89 V, the comparator 600 judges that this input voltage of 1.89 V is lower than 1.90 V, and thus, an output signal level of this comparator 600 becomes a high level. Since the switch SW7 is connected to the "b"-terminal side, the output level of the comparator 600 directly becomes a high level which is then entered into the counter 462. The counter 462 performs an up-counting operation, and this count value is supplied via the switch SW5 to be added to I(Q) in the adder 420.

As to the differential output (positive) "A+" of the D/A converter 500a (500b), the offset thereof is increased by this added value. That is to say, the voltage of 1.89 V is increased. Then, this operation is repeatedly carried out until the output signal level of the comparator 600 becomes a low level, namely the output voltage of "A+" becomes higher than 1.90 V. In this embodiment, when it is so assumed that an analog output of the D/A converter 500a (500b) is equal to 0.02 V with respect to an increment of the counter 462 by 1, a series of these operations are accomplished at such a timing when the counter 462 counts 1 time. At the time when a series of these operations are ended, this count value 1 is latched by the latch 463.

Next, the switch SW5 is connected to the "a"-terminal side thereof, and the correction value is entered into the adder 420. As this correction value, the data which have been latched in the latch 463 and the latch 464 are employed. In other words, the count value 8 of the latch 463 is added to the count value 1 of the latch 464 by the adder 465. An added value becomes 9, and this value 9 is reduced by ½ by the ½ circuit 466, so that a value of 4 is obtained as the correction value. Then, this correction value is added to the input signal by the adder 420. In this case, the differential output (positive) "A+" of the D/A converter 500a (500b) is corrected to become 1.97 V. Similarly, the differential output (negative) "A−" of this D/A converter 500a (500b) becomes 1.97 V, so that the offset may be canceled.

In accordance with this sixth embodiment, although the offset of the comparator 600 owns the error of the proper value Vref, if this value is constant as the comparison subjects of the differential output "A+" and the differential output "A−", then the absolute values have no relationship. As a result, since the above-described calculation is carried out, the offset of the comparator 600 gives no adverse influence, and thus, the offset of the D/A converter 500a (500b) can be canceled in high precision by employing the normal comparator.

It should also be noted that in the above-described sixth embodiment, the differential output (positive) "A+" must be set lower than, or equal to the voltage (Vref+offset voltage of comparator 600), conversely, the differential output (negative) "A−" must be set higher than, or equal to the voltage (Vref+offset voltage of comparator 600). In other words, as the initial data, such a low voltage data (e.g., 0 V) must be applied rather than applying of the data of 1.7 V, while considering sufficiently large margin. Thus, the longer offset canceling time is required.

Seventh Embodiment Mode

Figure 15:
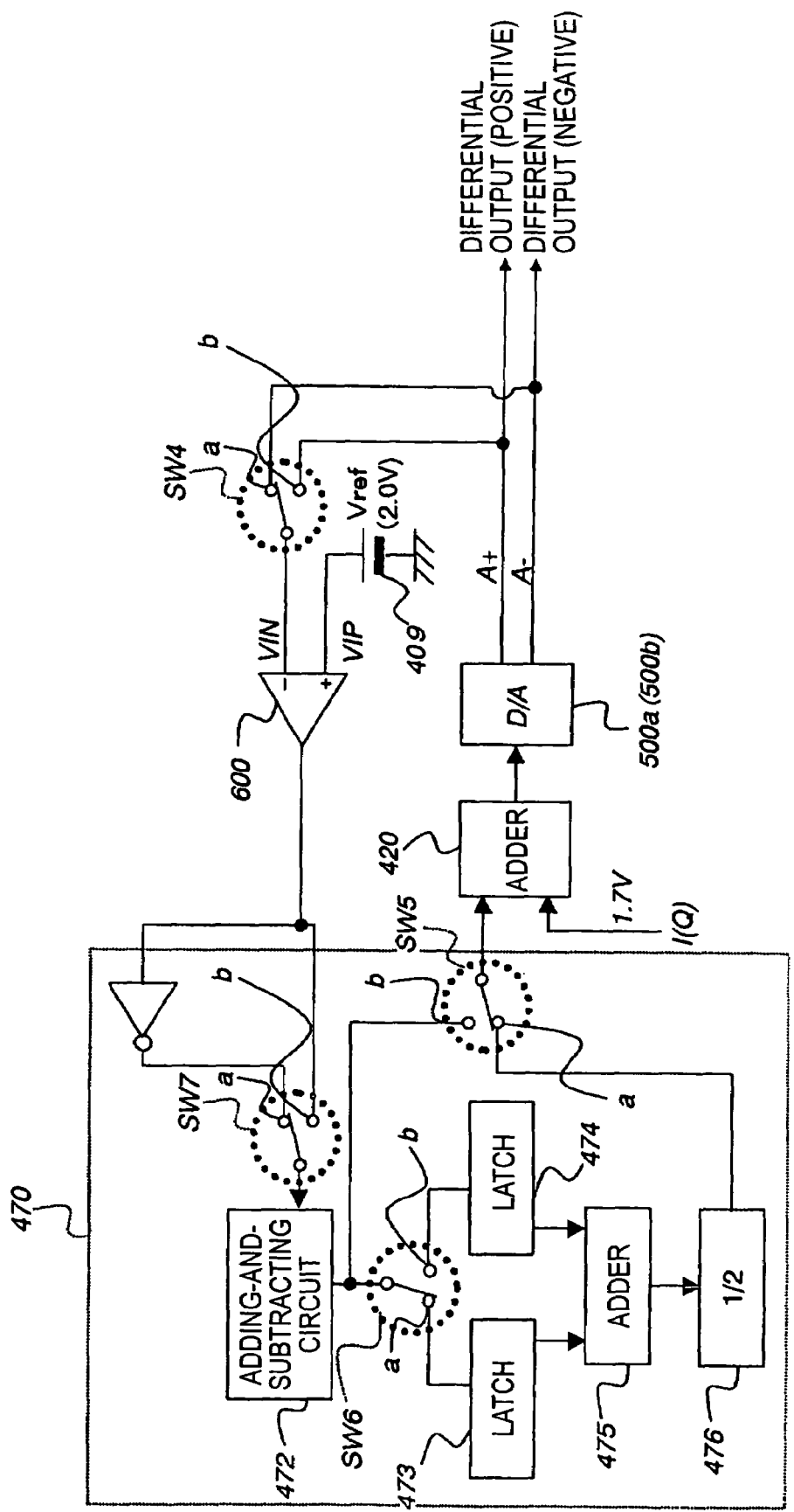
FIG. 15 is a circuit diagram for indicating an arrangement of an offset compensating apparatus according to a seventh embodiment of the present invention.

FIG. 15 is a circuit diagram for showing an arrangement of an offset compensating apparatus according to a seventh embodiment mode of the present invention. It should be understood that the same reference numerals shown in the second embodiment of FIG. 10 will be used for denoting the same, or similar circuit elements employed in the seventh embodiment. In the offset compensating apparatus of this seventh embodiment, a correction-value producing circuit 470 contains an inverter 471, an adding-and-subtracting circuit (up/down counter) 472, latches 473 and 474, an adder 475, an ½ circuit 476, another adder 420, a switch SW5, another switch SW6, and another switch SW7. The inverter 471 inverts an output signal of a comparator 600. The switch SW5 switches any one of an output signal of the counter 472 and an output signal of the ½ circuit 476 as an input signal to the adder 420. The switch SW6 enters an output signal of the adding-and-subtracting circuit 472 to be selectively inputted to either the latch 473 or the latch 474. Then, the switch SW7 switches any one of an output signal of the comparator 600 and an inverted comparator output signal as an input signal to the counter 472. Also, while the comparator equipped with the offset adjusting function explained in the above-described first embodiment is not used as the comparator 600, other arrangements are similar to those of the first embodiment shown in FIG. 10 except that the normal comparator is used.

Prior to canceling of offset of a D/A converter 500a (500b), a switch SW4 which is provided in an input stage of the comparator 600 is switched to an "a"-terminal side thereof, and also, both the switch SW6 and the switch SW7 which are mutually operated with respect to the switch SW4 are switched to "a"-terminal sides thereof. Also, the switch SW5 is switched to a "b"-terminal side thereof. As a result, the comparator 600 compares the reference voltage Vref connected to a noninverting terminal thereof with a differential output (negative) signal of the D/A converter 500a (500b) connected to an inverting terminal thereof so as to perform an offset canceling operation as to the output voltage "A−" of the D/A converter 500a (500b). The offset canceling result is latched by the latch 473.

Next, the switches SW4, SW6, and SW7 are switched to the "b"-terminal sides thereof. At this time, the comparator 600 compares the reference voltage Vref connected to the noninverting terminal thereof with a differential output (positive) signal of the D/A converter 500a (500b) connected to the inverting terminal thereof so as to perform an offset canceling operation as to the output voltage "A+" of the D/A converter 500a (500b) The offset canceling result is latched by the latch 474.

After a series of the above-described process operations have been accomplished, the switch SW5 is switched to the "a"-terminal side thereof, and also, both the value latched by the latch 473 and the value latched by the latch 474 are added to each other by the adder 475. The added result is converted into a ½ of this added value by the ½ circuit 476, and thereafter, the ½ added value is inputted to the adder 420. In other words, in such a case that the input/output of the D/A converter 500a (500b) contain offset, such a correction value capable of canceling this offset is outputted from the correction value producing circuit 470. Then, this correction value is applied to the input signal in the adder 420. Subsequently, an outline of operations of this offset compensating apparatus will now be described.

First of all, such a data corresponding to, for example, a DC signal of 1.7 V is inputted to the adder 420. At this time, the adding-and-subtracting circuit 472 executes an up-counting operation in synchronism with the data input of 1.7 V in the case that a signal level outputted from the comparator 600 is a high level, whereas in the case that a signal level outputted from the comparator 600 is a low level, the adding-and-subtracting circuit 472 performs a down-counting operation.

The switch SW5 directly supplies a calculation value outputted from the adding-and-subtracting circuit 472 to the adder 420 for a time period during which the offset cancel operation is sufficiently converged. Since the correction value applied to the adder 420 corresponds to "0" in the beginning stage, the input data of 1.7 V is directly applied to the D/A converter 500a (500b).

A converted output (analog signal) of this D/A converter 500a (500b) is supplied via the switch SW4 to the inverting terminal of the comparator 600, whereas the reference voltage Vref (2 V in this embodiment) is being applied to the noninverting terminal of the comparator 600.

When it is so assumed that an output voltage "A−" of the D/A converter 500a (500b) is equal to 1.89 V, the comparator 600 judges that this input voltage of 1.89 V is lower than the reference voltage Vref, and thus, an output signal level of this comparator 600 becomes a high level. Since the switch SW7 is connected to the "a"-terminal side, the output level of the comparator 600 becomes a low level which is then entered into the adding-and-subtracting circuit 472 so as to be down-counted. The down-counted value is supplied via the switch SW5 so as to be added in the adder 420.

When it is so assumed that the D/A converter 500a (500b) corresponds to such a D/A converter as a current adding type D/A converter, both the differential output (positive) "A+" and differential output (negative) "A−" of which necessarily own the inverting relationship, the offset of the differential output "A−" to which the value has been added maybe reduced. In other words, since the count value of the adding-and-subtracting circuit 472 becomes minus in the down-counting operation, the output voltage "A−" of 1.89 V is increased. Then, the down-counting operation of the adding-and-subtracting circuit 472 is carried out until this output voltage "A−" becomes higher than the reference voltage "Vref."

In this embodiment, when it is so assumed that an analog output of the D/A converter 500a (500b) is equal to 0.02 V with respect to an increment of the adding-and-subtracting circuit 472 by 1, since at such a timing when the counter 462 counts −6 times, the output of the comparator 600 becomes a low level, the adding-and-subtracting circuit 472 performs an up-counting operation. In other words, the value of the adding-and-subtracting circuit 472 is repeated at either −6 or −5, and after a predetermined time period has passed, a series of these operations are accomplished. When a series of these operations are ended, either the count value "−6" or the count value "−5" is latched by the latch 463.

Next, the switches SW4, SW6, and SW7 are connected to the "b"-terminal sides thereof. Then, a similar operation to the above-described operation is carried out. Now, when it is so assumed that the differential output voltage of "A+" is equal to 2.05 V, the comparator 600 judges that this input voltage of 2.05 V is higher than the reference voltage Vref, and thus, an output signal level of this comparator 600 becomes a low level. Since the switch SW7 is connected to the "b"-terminal side, the output level of the comparator 600 directly becomes a low level which is then entered into the adding-and-subtracting circuit 472. The adding-and-subtracting circuit 472 performs a down-counting operation, and this count value is supplied via the switch SW5 to be added to a value in the adder 420.

As to the differential output (positive) "A+" of the D/A converter 500a (500b), the offset thereof is increased by this added value. The count value of the adding-and-subtracting circuit 472 becomes minus in the down-counting operation, so that the output voltage of 2.05 V is decreased. Then, this operation is repeatedly carried out until the output signal level of the comparator 600 becomes a high level, namely the output voltage of "A+" becomes lower than the reference voltage Vref.

In this embodiment, when it is so assumed that an analog output of the D/A converter 500a (500b) is equal to 0.02 V with respect to an increment of the adding-and-subtracting circuit 472, at such a timing when the adding-and-subtracting circuit 472 counts −3 times, the output of the comparator 600 becomes a high level, so that the adding-and-subtracting circuit 472 performs an up-counting operation. In other words, the value of the adding-and-subtracting circuit 472 is repeated at either −3 or −2, and after a predetermined time period has passed, a series of these operations are accomplished. When a series of these operations are ended, either the count value "−3" or the count value "−2" is latched by the latch 474.

Next, the switch SW5 is connected to the "a"-terminal side thereof, and the correction value is entered into the adder 420. As this correction value, the data which have been latched in the latch 473 and the latch 474 are employed. In other words, the count value −6, or −5 of the latch 473 is added to the count value "−3", or "−2" of the latch 474 by the adder 475. An added value becomes −9, −8, or −7, and this value −9, −8, or −7 is reduced by ½ by the ½ circuit 476, so that a value of −4, or −3 is obtained as the correction value. Then, this correction value is added to the input signal by the adder 420.

In this case, the differential output (positive) "A+" of the D/A converter 500a (500b) is corrected to become 1.97 V, or 1.99 V. Similarly, the differential output (negative) "A−" of this D/A converter 500a (500b) becomes 1.97 V or 1.99 V, so that the offset may be canceled. However, as the error, the D/A converter 500a (500b) owns the value two times larger than the analog output (0.02 V step) of the D/A converter 500a (500b) in the worst case.

In accordance with this seventh embodiment, even in such a case that the voltage of the output "A−" is lower than the voltage of the output "A+", namely, even when the output voltage "A−" is equal to 1.65 V and the output voltage "A+" is equal to 1.71 V, the adding-and-subtracting circuit 432 performs the down-counting operation to execute a similar operation, so that the lower voltage (e.g., 0 V) data need not be forcibly applied to the adder 420. As a result, since only the adjusting time for adjusting the offset error may become sufficient, the offset cancel time can be shortened, as compared with that of the previous embodiment.

Eighth Embodiment Mode

Figure 16:
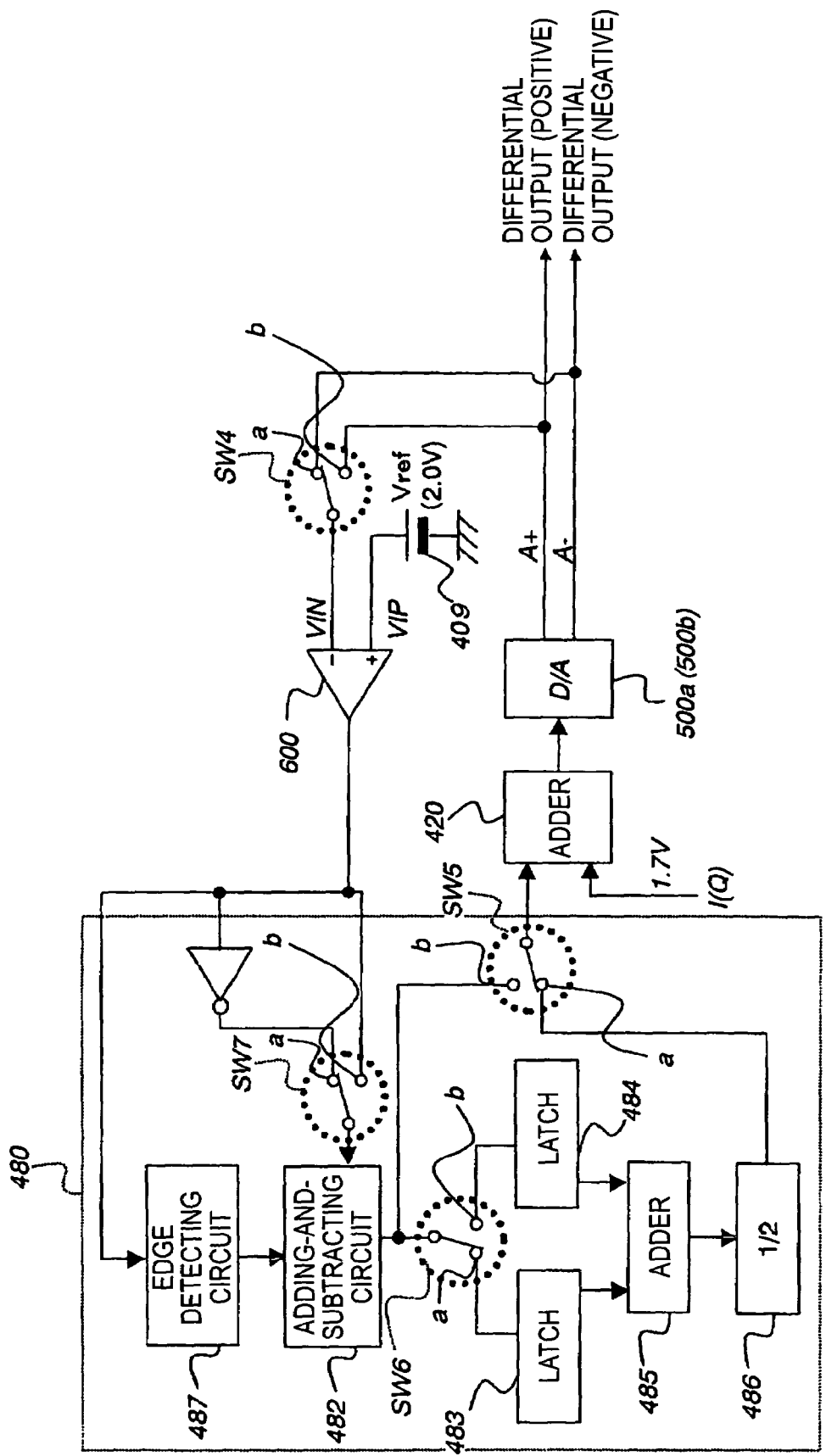
FIG. 16 is a circuit diagram for representing an arrangement of an offset compensating apparatus according to an eighth embodiment of the present invention.

FIG. 16 is a circuit diagram for showing an arrangement of an offset compensating apparatus according to an eighth embodiment mode of the present invention. It should be understood that the same reference numerals shown in the second embodiment of FIG. 10 will be used for denoting the same, or similar circuit elements employed in the eighth embodiment. In the offset compensating apparatus of this eighth embodiment, a correction value producing circuit 480 contains an inverter 481, an adding-and-subtracting circuit (up/down counter) 482, latches 483 and 484, an adder 485, an ½ circuit 486, an edge detecting circuit 487, a switch SW5, another switch SW6, and another switch SW7. The inverter 481 inverts an output signal of a comparator 600. The edge detecting circuit 487 detects both a rising edge and a falling edge of a comparator signal outputted from the comparator 600. The switch SW5 switches any one of an output signal of the counter 482 and an output signal of the ½ circuit 486 as an input signal to the adder 420. The switch SW6 enters an output signal of the adding-and-subtracting circuit 482 to be selectively inputted to either the latch 483 or the latch 484. Then, the switch SW7 switches any one of an output signal of the comparator 600 and an inverted comparator output signal as an input signal to the counter 482. Also, while the comparator equipped with the offset adjusting function explained in the above-described first embodiment is not used as the comparator 600, other arrangements are similar to those of the first embodiment shown in FIG. 10 except that the normal comparator is used.

Prior to canceling of offset of a D/A converter 500a (500b), a switch SW4 which is provided in an input stage of the comparator 600 is switched to an "a"-terminal side thereof, and also, both the switch SW6 and the switch SW7 which are mutually operated with respect to the switch SW4 are switched to "a"-terminal sides thereof. Also, the switch SW5 is switched to a "b"-terminal side thereof.

In this case, the comparator 600 compares the reference voltage Vref connected to, a noninverting terminal thereof with a differential output (negative) signal of the D/A converter 500a (500b) connected to an inverting terminal thereof so as to perform an offset canceling operation as to the output voltage "A−" of the D/A converter 500a (500b). The offset canceling result is latched by the latch 483.

Next, the switches SW4, SW6, and SW7 are switched to the "b"-terminal sides thereof. At this time, the comparator 600 compares the reference voltage Vref connected to the noninverting terminal thereof with a differential output (positive) signal of the D/A converter 500a (500b) connected to the inverting terminal thereof so as to perform an offset canceling operation as to the output voltage "A+" of the D/A converter 500a (500b) The offset canceling result is latched by the latch 484.

After a series of the above-described process operations have been accomplished, the switch SW5 is switched to the "a"-terminal side thereof, and also, both the value latched by the latch 483 and the value latched by the latch 484 are added to each other by the adder 485. The added result is converted into a ½ of this added value by the ½ circuit 486, and thereafter, the ½ added value is inputted to the adder 420. In other words, in such a case that the input/output of the D/A converter 500a (500b) contain offset, such a correction value capable of canceling this offset is outputted from the correction value producing circuit 480. Then, this correction value is applied to the input signal in the adder 420.

Subsequently, an outline of operations of this offset compensating apparatus will now be described. First of all, such a data corresponding to, for example, a DC signal of 1.7 V is inputted to the adder 420. At this time, the adding-and-subtracting circuit 482 starts an up-counting operation in synchronism with the data input of 1.7 V in such a case that a signal level outputted from the comparator 600 is a high level, whereas in the case that a signal level outputted from the comparator 600 is a low level, the adding-and-subtracting circuit 482 performs a down-counting operation.

The switch SW5 directly supplies a calculation value outputted from the adding-and-subtracting circuit 482 to the adder 420 for a long time period during which the offset cancel operation is sufficiently converged. Since the correction value applied to the adder 420 corresponds to "0" in the beginning stage, the input data of 1.7 V is directly applied to the D/A converter 500a (500b).

A converted output (analog signal) of this D/A converter 500a (500b) is supplied via the switch SW4 to the inverting terminal of the comparator 600, whereas the reference voltage Vref (2 V in this embodiment) is being applied to the noninverting terminal of the comparator 600.

When it is so assumed that an output voltage "A−" of the D/A converter 500a (500b) is equal to 1.89 V, the comparator 600 judges that this input voltage of 1.89 V is lower than the reference voltage Vref, and thus, an output signal level of this comparator 600 becomes a high level, and then this low level signal is inputted into the adding-and-subtracting circuit 482. This entered signal is down-counted and the down-counted signal is supplied via the switch SW5 so as to be added to the value in the adder 420.

When it is so assumed that the D/A converter 500a (500b) corresponds to such a D/A converter as a current adding type D/A converter, both the differential output (positive) "A+" and differential output (negative) "A−" of which necessarily own the inverting relationship, the offset of the differential output "A−" to which the value has been added may be reduced. That is to say, since the count value of the adding-and-subtracting circuit 482 becomes minus in the down-counting operation, the output voltage of 1.89 V is increased. Then, the signal is down-counted until the output signal of the comparator 600 becomes a high level, namely until the output voltage "A−" becomes higher than the reference voltage Vref.

In this embodiment, when it is so assumed that an analog output of the D/A converter 500a (500b) is equal to 0.02 V with respect to an increment of the adding-and-subtracting circuit 482 by 1, at such a timing when the counter 462 counts −6 times, the output signal of the comparator 600 becomes a low level. As a result, the adding-and-subtracting circuit 482 performs an up-counting operation.

In other words, while the count value of the adding-and-subtracting circuit 482 is repeated at either −6 or −5, after a predetermined time period has elapsed, a series of these operations are accomplished. The ending timing is defined by that the rising edge of the comparator 600 is detected by the edge detecting circuit 487. As a result, since the adding-and-subtracting circuit 482 finally performs the up-counting operation and then accomplishes this up-counting operation, the count value of "−5" is latched by the latch 483 at such a timing when the operation is ended.

Next, the switches SW4, SW6, and SW7 are connected to the "b"-terminal sides thereof. Then, a similar operation to the above-described operation is carried out. Now, when it is so assumed that the differential output voltage of "A+" is equal to 2.05 V, the comparator 600 judges that this input voltage of 2.05 V is higher than the reference voltage Vref, and thus, an output signal level of this comparator 600 becomes a low level. Since the switch SW7 is connected to the "b"-terminal side, the output level of the comparator 600 directly becomes a low level which is then entered into the adding-and-subtracting circuit 482. The adding-and-subtracting circuit 482 performs a down-counting operation, and this count value is supplied via the switch SW5 so as to be added to the value in the adder 420.

As to the differential output (positive) "A+" of the D/A converter 500a (500b), the offset thereof is increased by this added value. That is to say, since the count value of the adding-and-subtracting circuit 482 becomes minus in the down-counting operation, the output voltage of 2.05 V is decreased. Then, the signal is down-counted until the output signal of the comparator 600 becomes a high level, namely until the output voltage "A+" becomes lower the reference voltage Vref.

In this embodiment, when it is so assumed that an analog output of the D/A converter 500a (500b) is equal to 0.02 V with respect to an increment of the adding-and-subtracting circuit 482 by 1, at such a timing when the adding-and-subtracting circuit 462 counts −3 times, the output of the comparator 600 becomes a high level. As a result, the adding-and-subtracting circuit 482 performs an up-counting operation.

In other words, while the count value of the adding-and-subtracting circuit 482 is repeated at either −3 or −2, after a predetermined time period has elapsed, a series of these operations are accomplished. The ending timing is defined by that the falling edge of the comparator 600 is detected by the edge detecting circuit 487. As a result, since the adding-and-subtracting circuit 482 finally performs the down-counting operation and then accomplishes this down-counting operation, the count value of −3 is latched by the latch 484 at such a timing when the operation is ended.

Next, the switch SW5 is connected to the "a"-terminal side thereof, and the correction value is entered into the adder 420. As this correction value, the data which have been latched in the latch 483 and the latch 484 are employed. In other words, the count value "−5" of the latch 483 is added to the count value "−3" of the latch 484 by the adder 485. An added value becomes −8, and this value −8 is reduced by ½ by the ½ circuit 486, so that a value of −4 is obtained as the correction value. Then, this correction value is added by the adder 420.

In this embodiment, the differential output (positive) voltage "A+" of the D/A converter 500a (500b) is corrected to become 1.97 V, and the differential output (negative) voltage "A−" similarly becomes 1.97 V, so that the offset maybe canceled. At this time, while an attention is paid to such a fact that both the output voltage "A+" and the output voltage "A−" are the inverted outputs, if the value latched by either the latch 483 or the latch 484 is inverted (for example, "A−" holds smaller value and "A+" holds larger value), then the error caused by the offset of the comparator 600 can be offset, so that the offset canceling precision can be improved.

In accordance with this eighth embodiment, the calculating operation of the adding-and-subtracting circuit 482 is accomplished by detecting the falling edge of the output signal from the comparator 600 by using the edge detecting circuit 487. As a result, the fluctuations contained in the values which are finally latched by the latches 483 and 484 can be eliminated, the offset canceling time of the D/A converter 500a (500b) can be shortened, and further, while this error is reduced, the offset canceling precision can be made similar to that of the sixth embodiment.

Ninth Embodiment Mode

Figure 17:
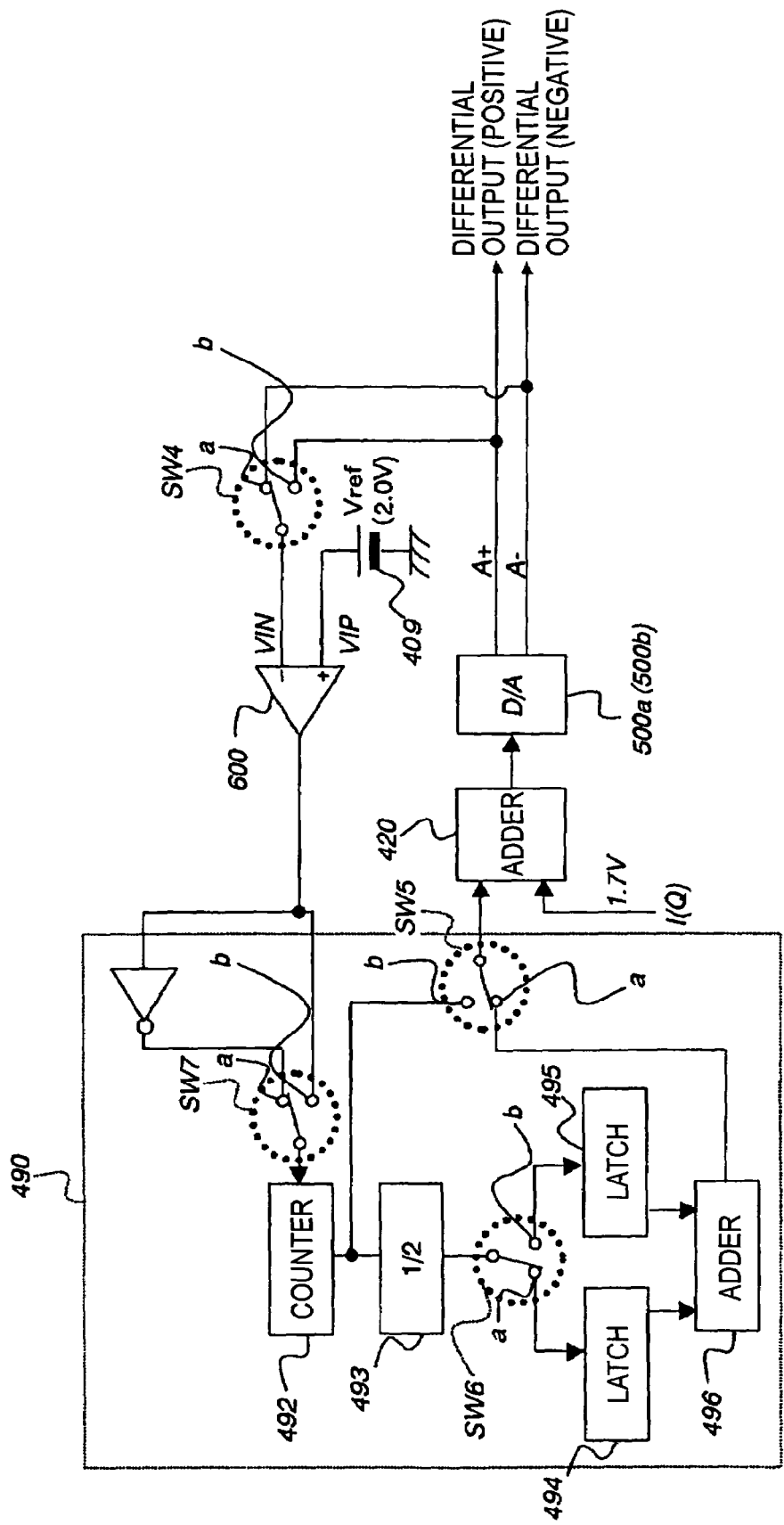
FIG. 17 is a circuit diagram for indicating an arrangement of an offset compensating apparatus according to a ninth embodiment of the present invention.

FIG. 17 is a circuit diagram for showing an arrangement of an offset compensating apparatus according to a ninth embodiment mode of the present invention. It should be understood that the same reference numerals shown in the sixth embodiment of FIG. 14 will be used for denoting the same, or similar circuit elements employed in the ninth embodiment. In the offset compensating apparatus of this ninth embodiment, an arrangement of a correction value producing circuit 490 is the same as that of the sixth embodiment indicated in FIG. 14 except that an ½ circuit 476 is interposed between a counter 492 and a switch SW6.

As to both the arrangement of the correction value producing circuit 490 according to this ninth embodiment and the arrangement of the correction value producing circuit 460 according to the sixth embodiment, only the insertion positions of the ½ circuits are different from each other, and operations thereof are similar to each other. As a consequence, an overall operation of this ninth embodiment is also similar to that of the sixth embodiment, and thus there is a similar effect thereto.

Tenth Embodiment Mode

Figure 18:
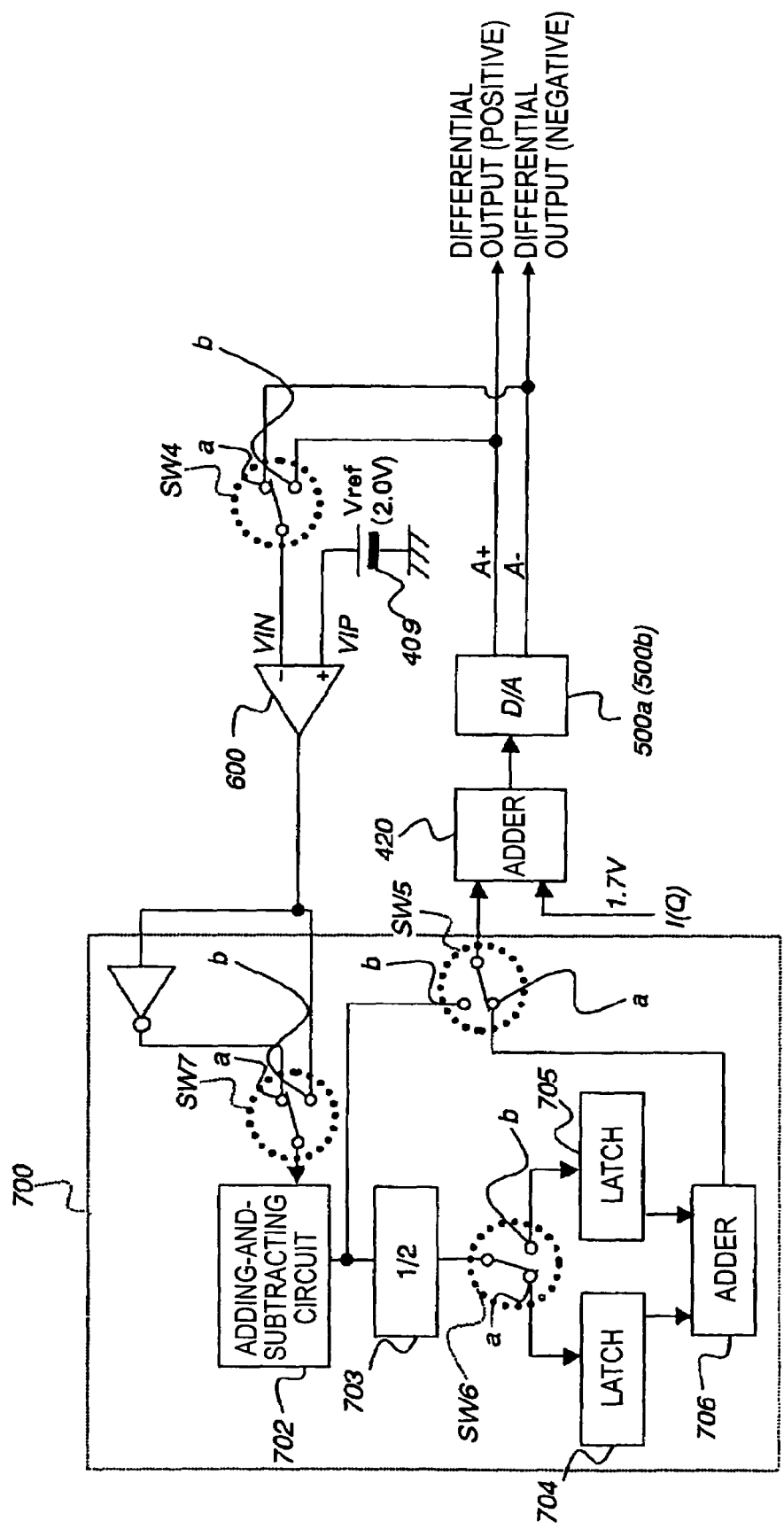
FIG. 18 is a circuit diagram for showing an arrangement of an offset compensating apparatus according to a tenth embodiment of the present invention.

FIG. 18 is a circuit diagram for showing an arrangement of an offset compensating apparatus according to a tenth embodiment mode of the present invention. It should be understood that the same reference numerals shown in the seventh embodiment of FIG. 15 will be used for denoting the same, or similar circuit elements employed in the seventh embodiment. In the offset compensating apparatus of this tenth embodiment, an arrangement of a correction value producing circuit 700 is the same as that of the seventh embodiment shown in FIG. 15 except that an ½ circuit 703 is interposed between an adding-and-subtracting circuit 702 and a switch SW6.

As to both the arrangement of the correction value producing circuit 700 according to this tenth embodiment and the arrangement of the correction value producing circuit 470 according to the seventh embodiment, only the insertion positions of the ½ circuits are different from each other, and operations thereof are similar to each other. As a consequence, an overall operation of this tenth embodiment is also similar to that of the seventh embodiment, and thus there is a similar effect thereto.

11-th Embodiment Mode

Figure 19:
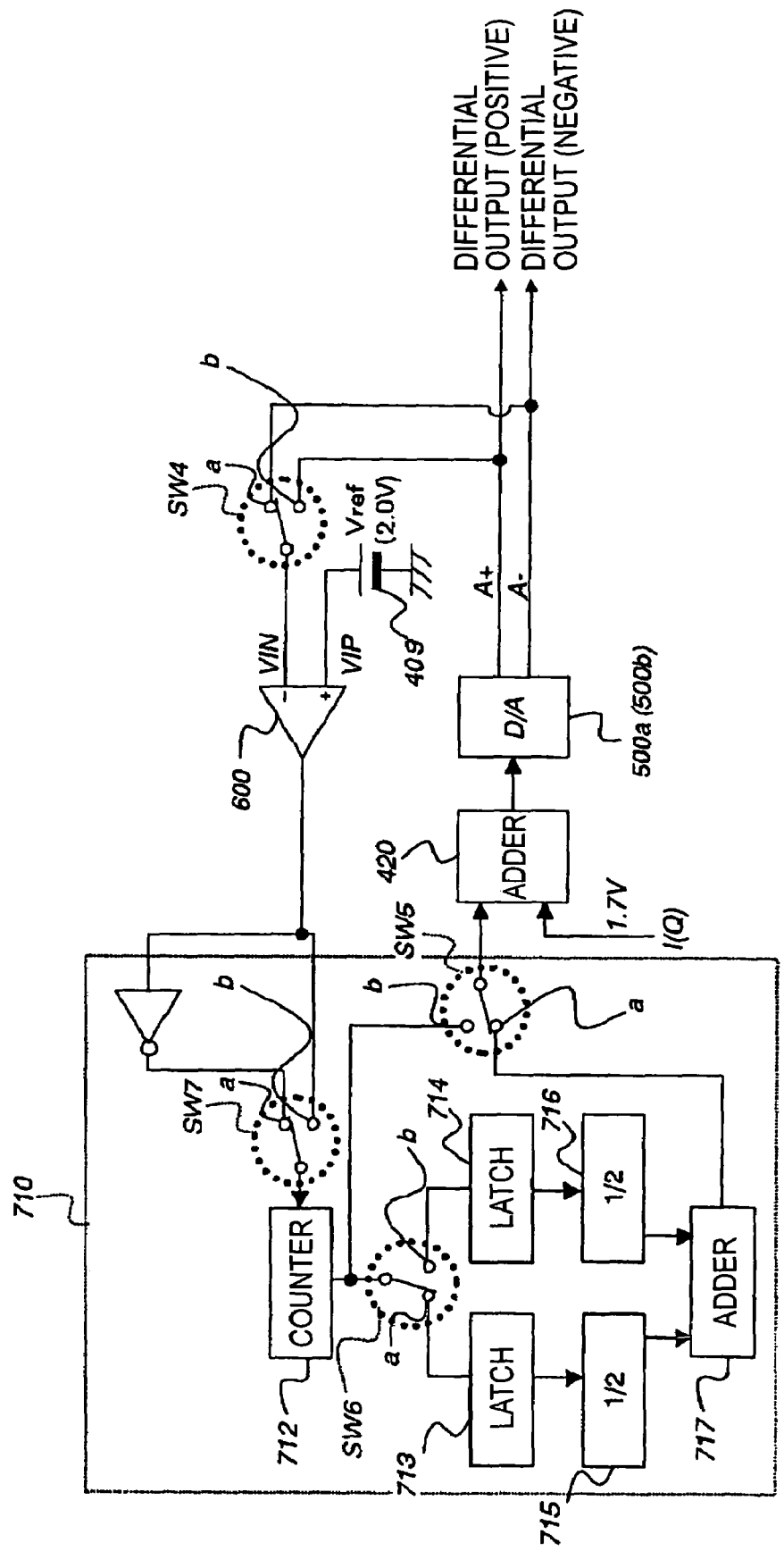
FIG. 19 is a circuit diagram for indicating an arrangement of an offset compensating apparatus according to an 11-th embodiment of the present invention.

FIG. 19 is a circuit diagram for showing an arrangement of an offset compensating apparatus according to an 11-th embodiment mode of the present invention. It should be understood that the same reference numerals shown in the sixth embodiment of FIG. 14 will be used for denoting the same, or similar circuit elements employed in the 11-th embodiment. In the offset compensating apparatus of this 11-th embodiment, a correction value producing circuit 710 is identical to that of the sixth embodiment shown in FIG. 14 except that an ½ circuit 715 is interposed between a latch 713 and an adder 717, and an ½ circuit 716 is inserted between a latch 714 and the adder 717.

With respect to the arrangement of the correction value producing circuit 460 according to the sixth embodiment, the correction value producing circuit 710 according to this 11-th embodiment is arranged by that the entire correction value producing system is subdivided into a correction value producing system for a negative differential output side and a correction value producing system for a positive differential output side, and then the ½ circuits 715 and 716 are inserted there into. Although a total number of the ½ circuits employed in the correction value producing circuit 710 is increased, operations thereof are similar to those of the correction value producing circuit 460 according to the sixth embodiment. Also, an entire operation of this 11-th embodiment is similar to that of the sixth embodiment, and thus, a similar effect thereto may be achieved.

12-th Embodiment Mode

Figure 20:
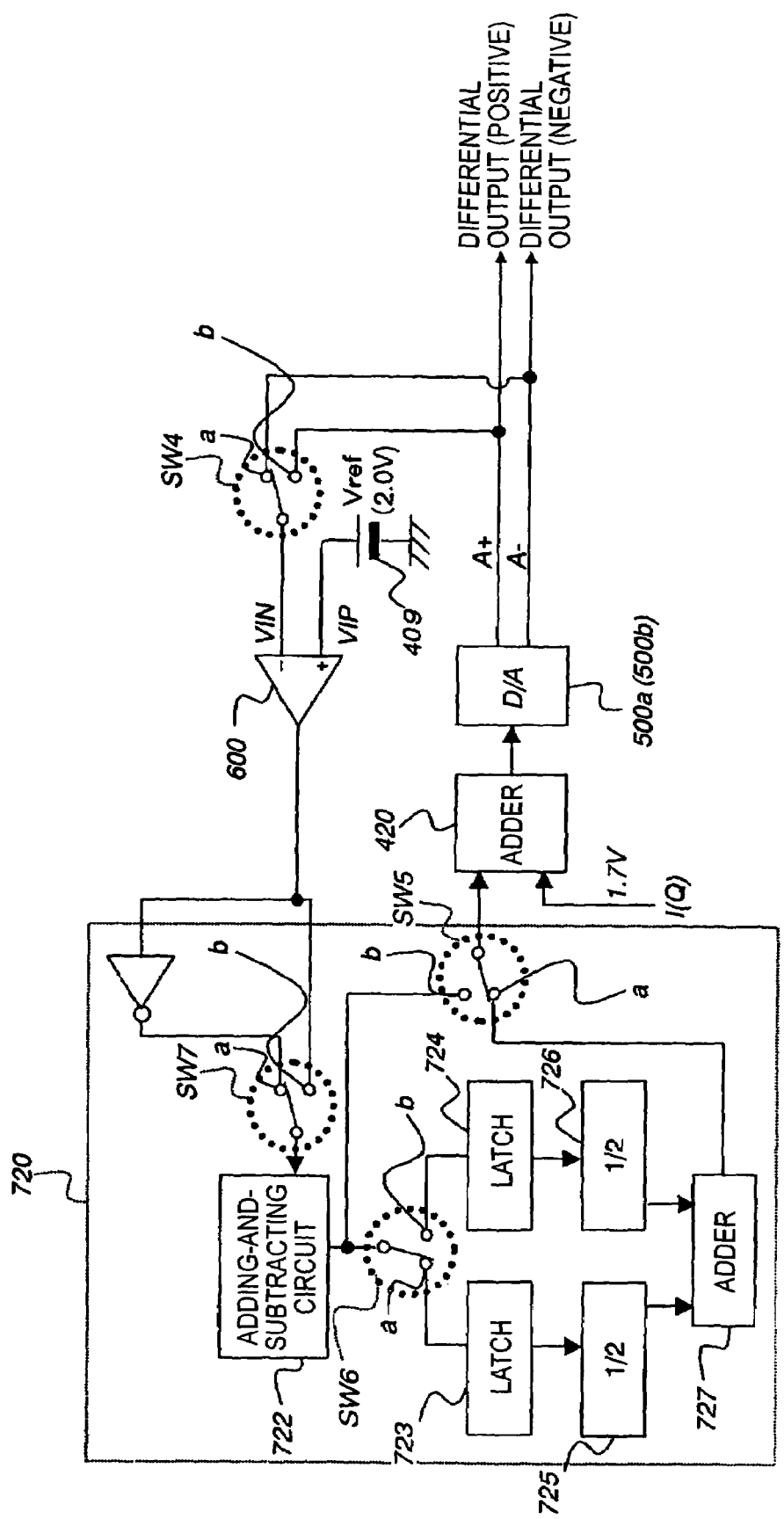
FIG. 20 is a circuit diagram for representing an arrangement of an offset compensating apparatus according to a 12-th embodiment of the present invention.

FIG. 20 is a circuit diagram for showing an arrangement of an offset compensating apparatus according to a 12-th embodiment mode of the present invention. It should be understood that the same reference numerals shown in the sixth embodiment of FIG. 15 will be used for denoting the same, or similar circuit elements employed in the 12-th embodiment. In the offset compensating apparatus of this 12-th embodiment, a correction value producing circuit 720 is identical to that of the seventh embodiment shown in FIG. 15 except that an ½ circuit 723 is interposed between a latch 725 and an adder 727, and an ½ circuit 726 is inserted between a latch 724 and the adder 727.

With respect to the arrangement of the correction value producing circuit 470 according to the seventh embodiment, the correction value producing circuit 720 according to this 12-th embodiment is arranged by that the entire correction value producing system is subdivided into a correction value producing system for a negative differential output side and a correction value producing system for a positive differential output side, and then the ½ circuits 723 and 726 are inserted there into. Although a total number of the ½ circuits employed in the correction value producing circuit 720 is increased, operations thereof are similar to those of the correction value producing circuit 470 according to the seventh embodiment. Also, an entire operation of this 12-th embodiment is similar to that of the seventh embodiment, and thus, a similar effect thereto may be achieved.

13-th Embodiment Mode

Figure 21:
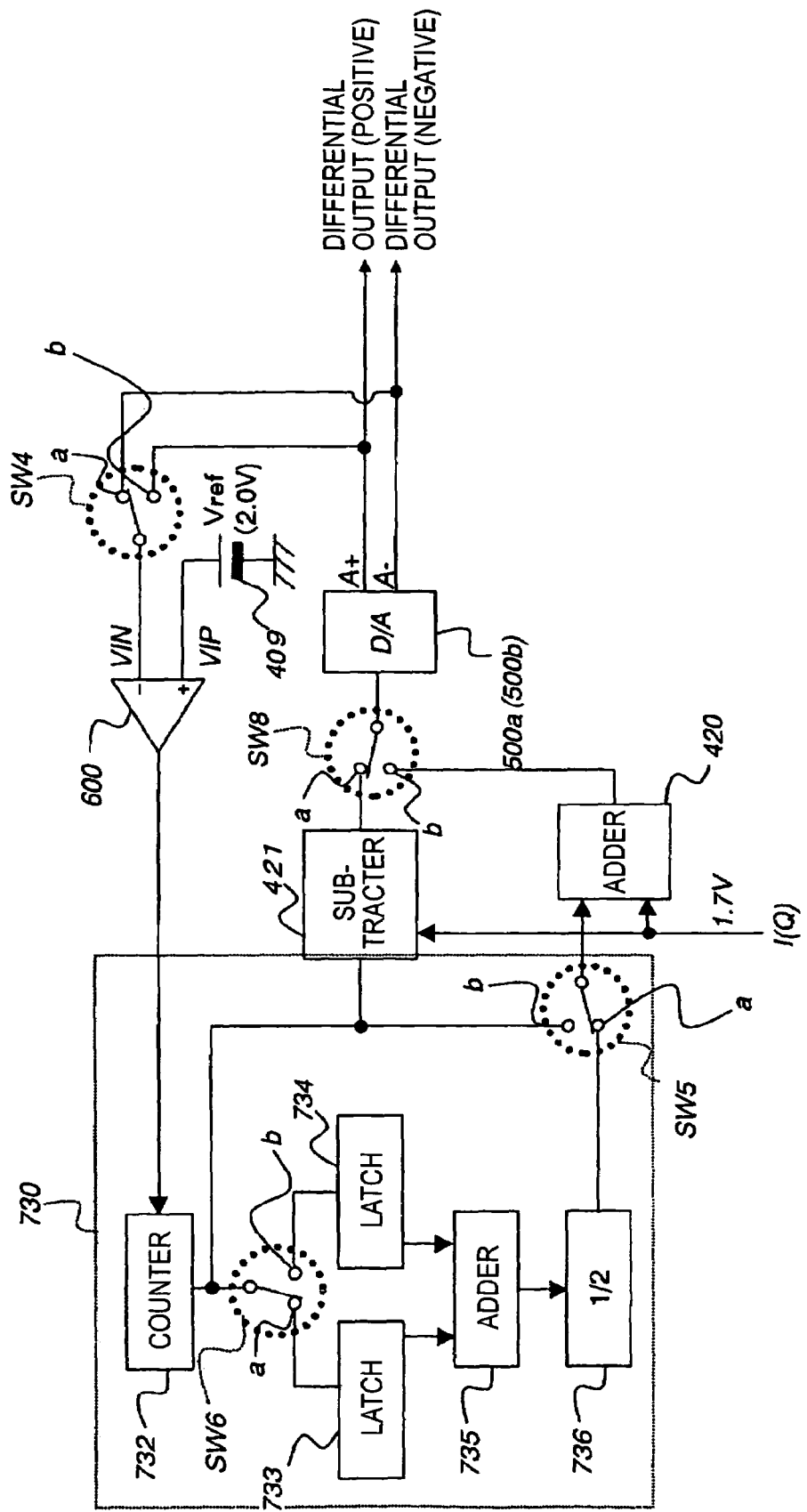
FIG. 21 is a circuit diagram for indicating an arrangement of an offset compensating apparatus according to a 13-th embodiment of the present invention.

FIG. 21 is a circuit diagram for showing an arrangement of an offset compensating apparatus according to a 13-th embodiment mode of the present invention. It should be understood that the same reference numerals shown in the sixth embodiment of FIG. 14 will be used for denoting the same, or similar circuit elements employed in the 13-th embodiment. In the offset compensating apparatus of this 13-th embodiment, a correction value producing circuit 730 contains a counter 732, latches 733 and 734, an adder 735, an ½ circuit 736, a switch SW5, and another switch SW6. The correction value producing circuit 730 further contains a subtracter 421, and another switch SW8. The switch SW5 switches any one of an output signal of the counter 732 and an output signal of the ½ circuit 736 as an input signal to the adder 420. The switch SW6 enters an output signal of the counter 732 to be selectively inputted to either the latch 733 or the latch 734. The subtracter 421 subtracts a count value outputted from the counter 732. The switch SW8 switches an output signal of the subtracter 421 and an output signal of the adder. 420 to enter the switched signal into a D/A converter 500a (500b). Also, while the comparator equipped with the offset adjusting function explained in the above-described first embodiment is not used as the comparator 600, other arrangements are similar to those of the sixth embodiment shown in FIG. 14 except that such a comparator is used that the offset is present during the normal comparing/measuring operation.

Prior to canceling of offset of a D/A converter 500a (500b), a switch SW4 which is provided in an input stage of the comparator 600 is switched to an "a"-terminal side thereof, and also, both the switch SW6 and the switch SW8 which are mutually operated with respect to the switch SW4 are connected to "a"-terminal sides thereof. Also, the switch SW5 is connected to a "b"-terminal side thereof. As a result, the comparator 600 compares the reference voltage Vref connected to a noninverting terminal thereof with a differential output (negative) signal of the D/A converter 500a (500b) connected to an inverting terminal thereof so as to perform an offset canceling operation as to the output voltage "A−" of the D/A converter 500a (500b) The offset canceling result is latched by the latch 733.

Next, the switches SW4, SW6, and SW8 are switched to the "b"-terminal sides thereof. At this time, the comparator 600 compares the reference voltage Vref connected to the noninverting terminal thereof with a differential output (positive) signal of the D/A converter 500a (500b) connected to the inverting terminal thereof so as to perform an offset canceling operation as to the output voltage "A+" of the D/A converter 500a (500b) The offset canceling result is latched by the latch 734.

After a series of the above-described process operations have been accomplished, the switch SW5 is switched to the "a"-terminal side thereof, and also, both the value latched by the latch 733 and the value latched by the latch 734 are added to each other by the adder 735. The added result is converted into a ½ of this added value by the ½ circuit 736, and thereafter, the ½ added value is inputted to the adder 420. In other words, in such a case that the input/output of the D/A converter 500a (500b) contains offset, such a correction value capable of canceling this offset is outputted from the correction value producing circuit 730. Then, this correction value is applied to the input signal in the adder 420.

At this time, in the case that the output voltage "A−" of the D/A converter 500*a* (500*b*) is lower than the reference voltage Vref, the output signal of the comparator 600 becomes a high level, the counter 732 executes an up-counting operation, and the subtracter 421 subtracts the count value from I(Q) to enter the subtracted count value into the D/A converter 500*a* (500*b*). As a result, the output voltage "A−" of the D/A converter 500*a* (500*b*) is increased. At such a timing when the output voltage "A−" becomes equal to the reference voltage Vref, the counting operation of the counter 732 is ended, and also, the count value obtained at this time is latched by the latch 733.

Even in the case that the output voltage "A+" of the D/A converter 500*a* (500*b*) is lower than the reference voltage Vref, the output signal of the comparator 600 becomes a high level, the counter 732 executes an up-counting operation, and the adder 420 adds the count value from I(Q) to enter the added count value into the D/A converter 500*a* (500*b*). As a result, the output voltage "A+" of the D/A converter 500*a* (500*b*) is increased. At such a timing when the output voltage "A+" becomes equal to the reference voltage Vref, the counting operation of the counter 732 is ended, and also, the count value obtained at this time is latched by the latch 734.

The subsequent operation of this 13-th embodiment is similar to that of the sixth embodiment shown in FIG. 14, and thus, the offset canceling precision by the D/A converter 500*a* (500*b*) can be improved by employing the normal comparator 600.

14-th Embodiment Mode

Figure 22:
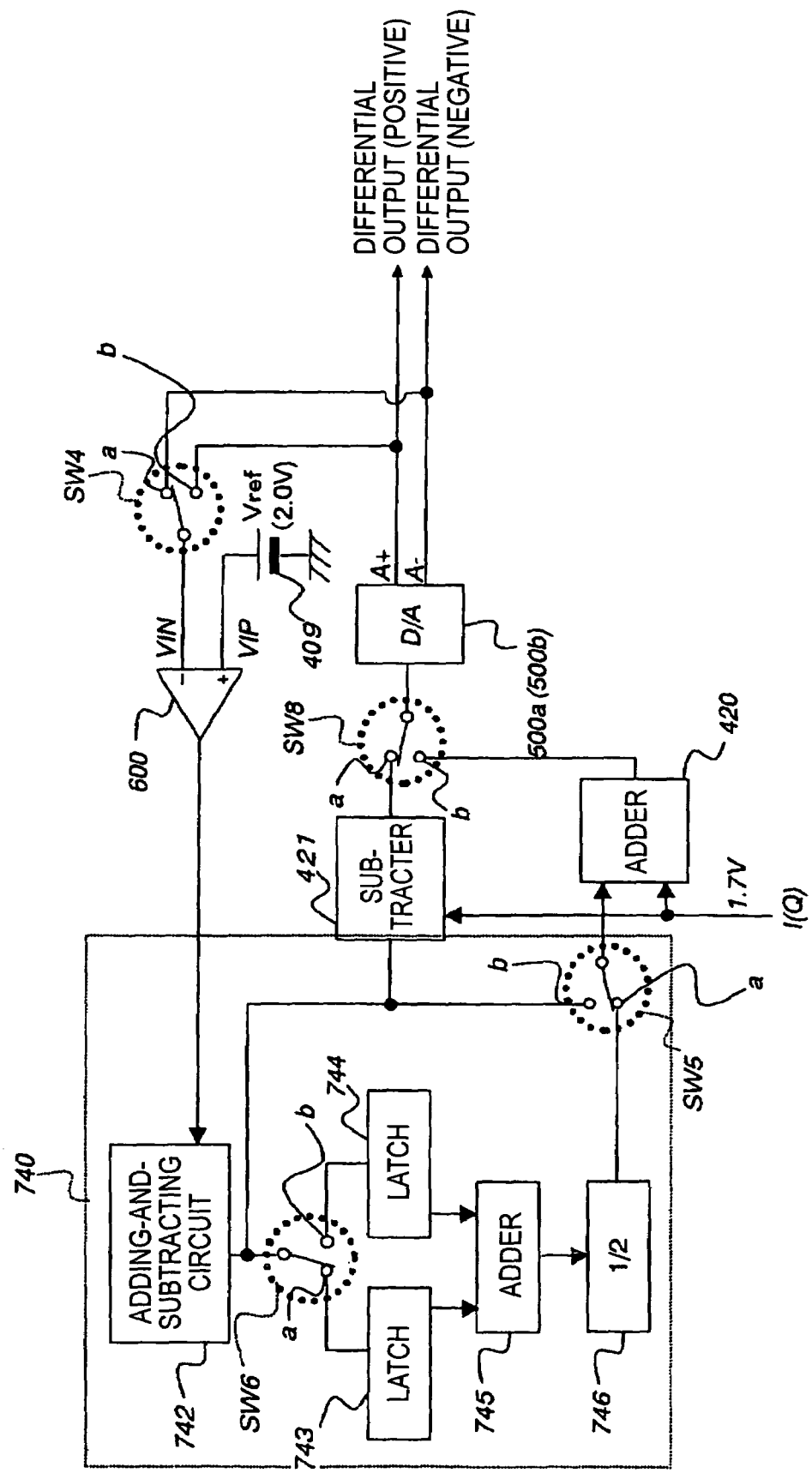
FIG. 22 is a circuit diagram for showing an arrangement of an offset compensating apparatus according to a 14-th embodiment of the present invention.

FIG. 22 is a circuit diagram for showing an arrangement of an offset compensating apparatus according to a 14-th embodiment mode of the present invention. It should be understood that the same reference numerals shown in the 13-th embodiment of FIG. 21 will be used for denoting the same, or similar circuit elements employed in the 14-th embodiment. In the offset compensating apparatus of this 14-th embodiment, an adding-and-subtracting circuit (up/down counter) 742 of a correction value producing circuit 740 is employed instead of the counter of the 13-th embodiment, and other arrangements thereof are similar to those of the 13-th embodiment.

In accordance with this 14-th embodiment, since the adding-and-subtracting circuit 742 is used in the correction value producing circuit 740, offset canceling precision of the D/A converter 500*a* (500*b*) can be improved and offset canceling time can be shortened.

15-th Embodiment Mode

Figure 23:
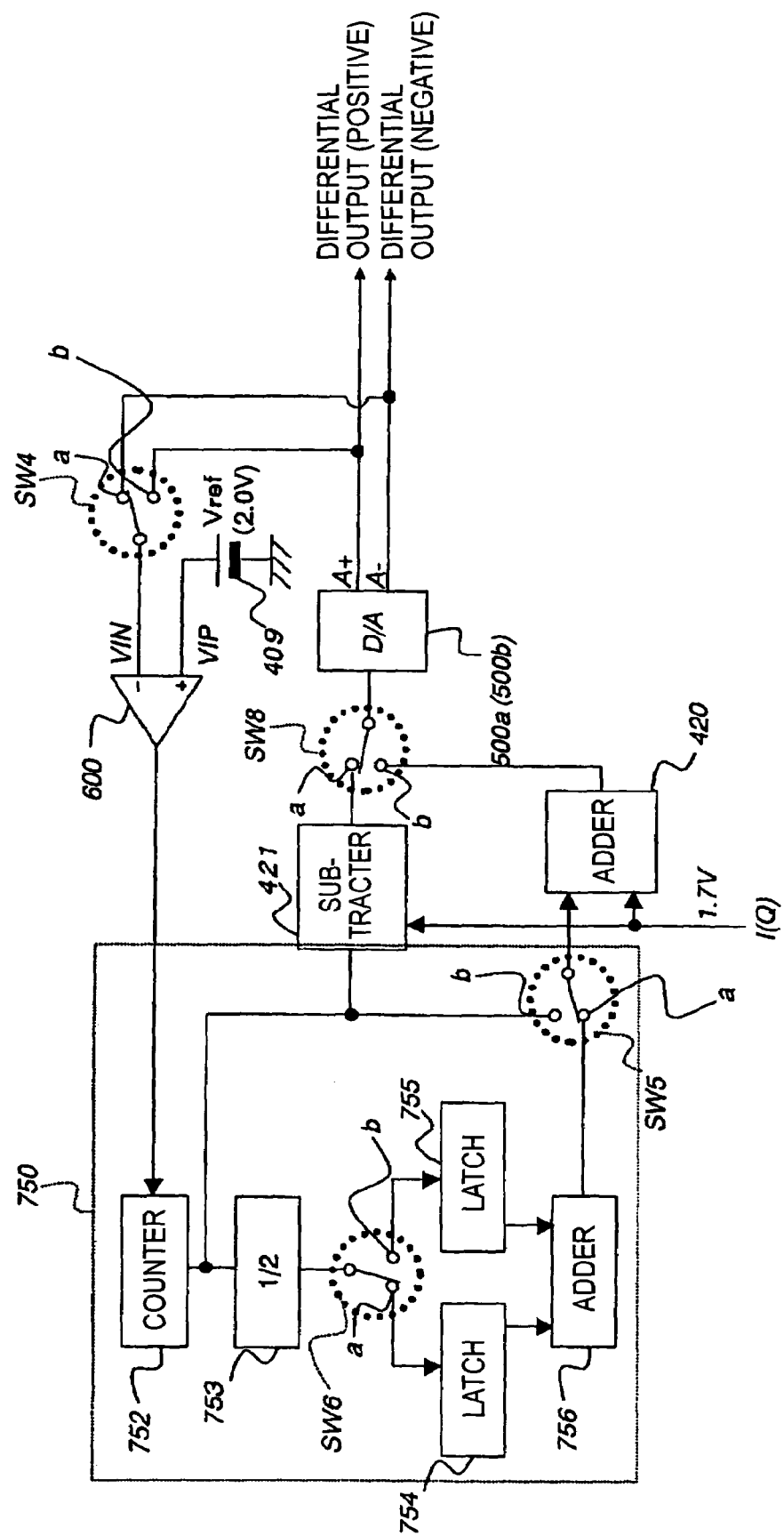
FIG. 23 is a circuit diagram for indicating an arrangement of an offset compensating apparatus according to a 15-th embodiment of the present invention.

FIG. 23 is a circuit diagram for showing an arrangement of an offset compensating apparatus according to a 15-th embodiment mode of the present invention. It should be understood that the same reference numerals shown in the 13-th embodiment of FIG. 21 will be used for denoting the same, or similar circuit elements employed in the 15-th embodiment. In the offset compensating apparatus of this 15-th embodiment, an arrangement of a correction value producing circuit 750 is the same as that of the 13-th embodiment indicated in. FIG. 21 except that an ½ circuit 753 is interposed between a counter 752 and a switch SW6.

As to both the arrangement of the correction value producing circuit 750 according to this 15-th embodiment and the arrangement of the correction value producing circuit 730 according to the 13-th embodiment, only the insertion positions of the ½ circuits are different from each other, and operations thereof are similar to each other. As a consequence, an overall operation of this 15-th embodiment is also similar to that of the 13-th embodiment, and thus there is a similar effect thereto.

16-th Embodiment Mode

Figure 24:
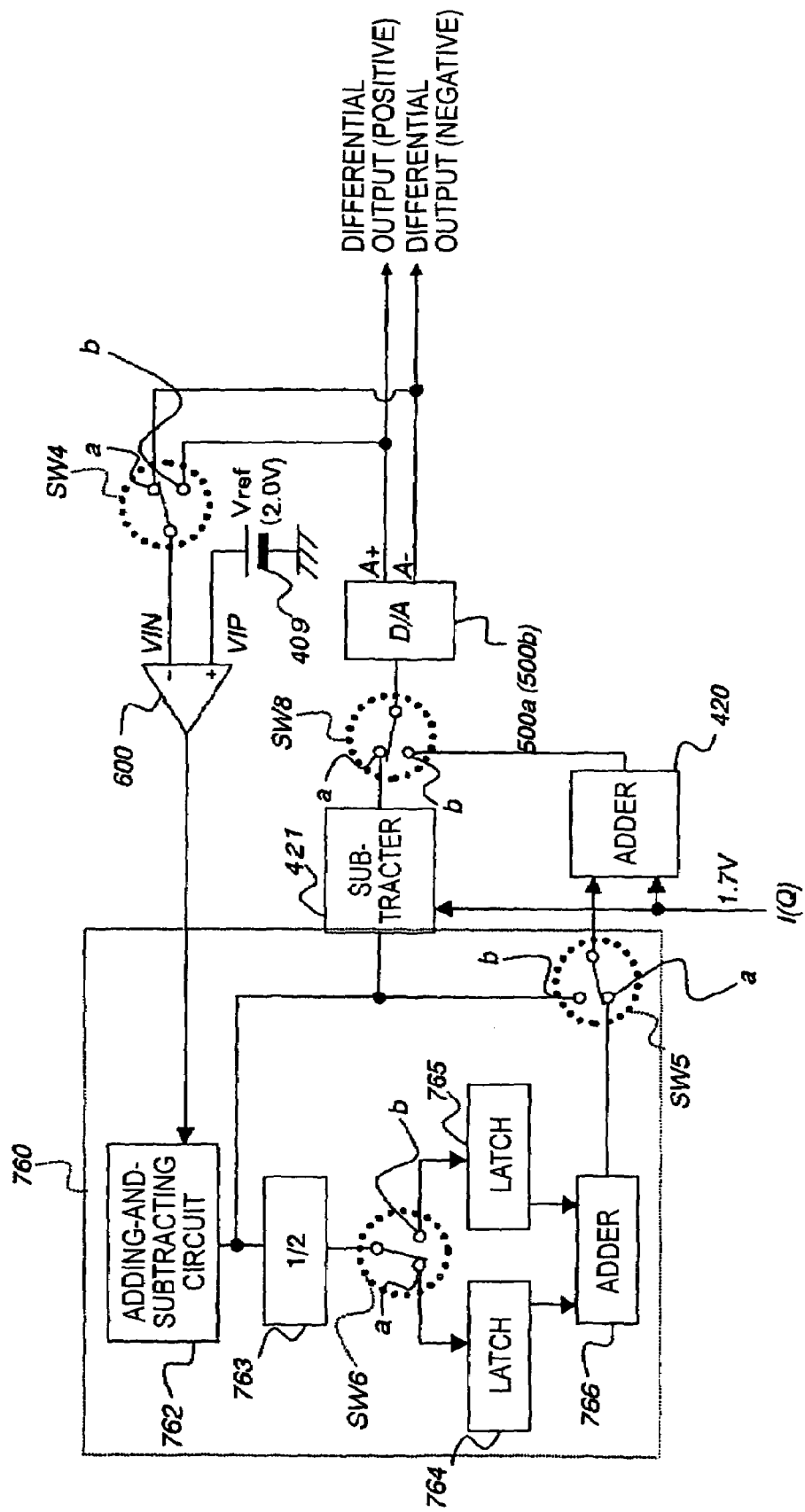
FIG. 24 is a circuit diagram for showing an arrangement of an offset compensating apparatus according to a 16-th embodiment of the present invention.

FIG. 24 is a circuit diagram for showing an arrangement of an offset compensating apparatus according to a 16-th embodiment mode of the present invention. It should be understood that the same reference numerals shown in the 14-th embodiment of FIG. 22 will be used for denoting the same, or similar circuit elements employed in the 16-th embodiment. In the offset compensating apparatus of this 16-th embodiment, an arrangement of a correction value producing circuit 750 is the same as that of the 14-th embodiment indicated in FIG. 22 except that an ½ circuit 753 is interposed between a counter 752 and a switch SW6.

As to both the arrangement of the correction value producing circuit 760 according to this 16-th embodiment and the arrangement of the correction value producing circuit 730 according to the 14-th embodiment, only the insertion positions of the ½ circuits are different from each other, and operations thereof are similar to each other. As a consequence, an overall operation of this 16-th embodiment is also similar to that of the 14-th embodiment, and thus there is a similar effect thereto.

As previously described, in accordance with the invention, the differential amplifying circuit is operated as the operational amplifying circuit, and the inverse-phase signal of the output signal from this operational amplifying circuit is fed back to one transistor which constitutes the differential amplifying circuit. As a result, the comparison precision can be improved, and the comparison precision can be improved in low cost with employment of the simple circuit.

Also, in accordance with the invention, since the offset of the electronic apparatus is measured by eliminating the adverse influence caused by the offset of the comparing means side, the offset canceling operation of the electronic apparatus can be carried out in high precision.

Also, in accordance with the invention, the converged value of the error signals of the comparing means can be counted in high precision by employing the simple-structured counter.

Also, in accordance with the invention, since the converged value of the error signals of the comparing means is counted in high precision by employing the simple-structured adding-and-subtracting circuit, the time period required to perform the offset canceling operation of the electronic apparatus in high precision can be shortened.

Also, in accordance with the invention, the half value of the offset correction value which is originally required is produced from the half value of the converged value which is acquired by measuring the offset of the electronic apparatus, and then, this half offset correction value is employed as the offset correction value. As a consequence, the offset canceling operation of the current adding type D/A converter can be carried out in high precision.

Also, in accordance with the invention, since the offset measuring operation for the electronic apparatus is carried out by employing the comparing circuit having relatively high comparing precision and manufactured in low cost, the high-precision offset canceling operation of the electronic apparatus can be carried out in low cost.

Also, in accordance with the invention, the connection value is acquired by performing the calculation in such a manner that both the offset measuring operation of the inverting output signal of the electronic apparatus and the offset measuring operation of the noninverting output signal thereof are carried out by the respective comparing means so as to acquire the converged values, and then the offset of these comparing means, which is contained in this converged value, may be canceled. As a result, the high-precision offset canceling operation of the electronic apparatus can be carried out in low cost with employment of the normal comparing means.

Also, in accordance with the invention, the converged values which are obtained by measuring the offset of the inverting output signal and the offset of the noninverting output signal are added to each other, and then, the offset contained in these converged values is canceled. As a result, the offset owned by the normal comparing means having the simple circuit during the measuring operation can be eliminated.

Further, in accordance with the present invention, the high-precision offset canceling operation for the D/A converter can be carried out in low cost.

What is claimed is:

1. An offset compensating apparatus which compensates offset of an inverted signal and a non-inverted signal output from paired output ports of an electronic apparatus, the inverted and the non-inverted signals being in accordance with an input signal to the electronic apparatus, comprising:

a selector for selecting one of the inverted signal and the non-inverted signal from the electronic apparatus;

adjusting and comparing means, for obtaining a difference value between the inverted signal selected by the selector and a reference signal having no relationship to said inverted signal, and holding said difference value, and for conducting an error signal indicative of a difference between an non-inverted signal selected by the selector and a signal produced by reflecting said held difference value onto said reference signal; and calculating means for adding a value corresponding to said error signal to said input signal, wherein said calculating means includes a counter.

2. An offset compensating apparatus which compensates offset of an inverted signal and a non-inverted signal output from paired output ports of an electronic apparatus, the inverted and the non-inverted signals being in accordance with an input signal to the electronic apparatus, comprising:

a selector for selecting one of the inverted signal and the non-inverted signal from the electronic apparatus;

adjusting and comparing means, for obtaining a difference value between the inverted signal selected by the selector and a reference signal having no relationship to said inverted signal, and holding said difference value, and for conducting an error signal indicative of a difference between an non-inverted signal selected by the selector and a signal produced by reflecting said held difference value onto said reference signal; and calculating means for adding a value corresponding to said error signal to said input signal, wherein said calculating means includes an adding-and-subtracting circuit.

3. An offset compensating apparatus as claimed in claim 1 or 2, wherein said adjusting and comparing means and is a comparing circuit comprising:

a differential circuit in which two signals are compared with each other, which are entered into a differential pair formed by a first transistor and a second transistor, the differential circuit having said differential pair and a load circuit of said differential pair;

phase adjusting means which operates said differential circuit as an operational amplifying circuit;

phase inverting means which inverts a phase of an output signal from said differential circuit;

feedback means which feeds back an output signal of said phase inverting means as a substrate biasing voltage of said first transistor in the case that said differential circuit is operated as the operational amplifying circuit by said phase adjusting means, and either same voltages or different voltages are applied to said first transistor and said second transistor of said differential pair respectively; and holding means for holding said substrate biasing voltage of said first transistor in a predetermined time duration, which is fed back by said feedback means.

4. An offset compensating apparatus as claimed in claim 1 or 2, wherein said electronic apparatus corresponds to a D/A (digital-to-analog) converting circuit.

* * * * *